US007108898B2

(12) United States Patent
Yoshinari

(10) Patent No.: US 7,108,898 B2
(45) Date of Patent: *Sep. 19, 2006

(54) MULTICOLOR IMAGE FORMING MATERIAL AND METHOD OF MULTICOLOR IMAGE FORMATION

(75) Inventor: Shinichi Yoshinari, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 176 days.

This patent is subject to a terminal disclaimer.

(21) Appl. No.: 10/650,716

(22) Filed: Aug. 29, 2003

(65) Prior Publication Data

US 2004/0046858 A1 Mar. 11, 2004

(30) Foreign Application Priority Data

Aug. 29, 2002 (JP) .......................... P.2002-251872

(51) Int. Cl.
*B41M 5/40* (2006.01)
*G03F 7/34* (2006.01)

(52) U.S. Cl. .............................. 428/32.77; 428/32.78; 428/32.79; 430/200; 430/271.1; 430/952

(58) Field of Classification Search ..................... None
See application file for complete search history.

(56) References Cited

U.S. PATENT DOCUMENTS 6,468,634 B1 * 10/2002 Miyake et al. ............. 428/32.6
6,689,717 B1 * 2/2004 Fujimori ..................... 503/227
6,824,845 B1 * 11/2004 Wachi et al. ............ 428/32.81
6,830,863 B1 * 12/2004 Wachi et al. ............... 430/200
6,856,337 B1 * 2/2005 Shimomura et al. ........ 347/224
6,864,033 B1 * 3/2005 Nakamura et al. .......... 430/200
6,911,294 B1 * 6/2005 Yoshinari .................... 430/203

FOREIGN PATENT DOCUMENTS

JP 5-58045 A 3/1993
JP 6/219052 A 8/1994

* cited by examiner

*Primary Examiner*—Jennifer C. McNeil
*Assistant Examiner*—Timothy M. Speer
(74) *Attorney, Agent, or Firm*—Sughrue Mion, PLLC

(57) ABSTRACT

A multicolor image forming material comprising: an image receiving sheet comprising an image receiving layer; and at least five heat transfer sheets different in color each comprising a substrate, a light-heat conversion layer and an image forming layer, each of the heat transfer sheets being adapted to be superposed on the image receiving sheet with the image forming layer facing the image receiving layer and irradiated with laser light to transfer the irradiated area of the image forming layer to the image receiving layer to record an image on the image receiving sheet, wherein an area of the recording has a size of 515 mm by 728 mm or larger, the image forming layer of at least one of the heat transfer sheets has a thickness of 0.6 μm or greater, and the at least one of the heat transfer sheets has an adhesive strength of 8 g/cm or higher between the light-heat conversion layer and the image forming layer in a non-irradiated area thereof.

12 Claims, 4 Drawing Sheets

MULTICOLOR IMAGE FORMING MATERIAL AND METHOD OF MULTICOLOR IMAGE FORMATION

FIELD OF THE INVENTION

This invention relates to a material and a method for forming a full color image with high resolution by laser thermal transfer recording. More particularly, it relates to a material and a method for multicolor image formation useful to obtain direct digital color proofs (DDCPs) in the field of printing or mask images according to digital image information.

BACKGROUND OF THE INVENTION

In the field of graphic arts, a printing plate is produced using a set of color separations of a color original which are prepared using lithographic films. In general, color proofs are prepared from color separations in order to inspect for errors in color separation and to check the need for color correction and the like before printing. Color proofs are required to realize high resolution enabling accurate half tone reproduction and high processing stability. To obtain color proofs close to actual prints, it is desirable for the materials of color proofs to be the same as those used on press, i.e., the same paper and the same pigments. There is a higher demand for a dry process involving no processing solutions for the preparation of color proofs.

With the recent spread of computerized systems in pre-press work, recording systems for preparing color proofs directly from digital signals (dry process) have been developed. Such computerized systems, particularly contemplated for preparing high quality color proofs, are generally capable of reproducing dot images at 150 lines or more per inch. In order to obtain high quality proofs from digital signals, a laser beam is used as a recording head, which is capable of modulation according to digital signals and focusing into a small spot diameter. Hence it is demanded to develop image forming elements that exhibit high sensitivity to laser light and high resolution enabling reproduction of highly precise dot images.

Image forming elements known useful in laser transfer methods include a thermal melt transfer sheet, which comprises a substrate, a light-heat conversion layer capable of absorbing laser light to generate heat, and an image forming layer having a pigment dispersed in a heat fusible matrix (e.g., a wax or a binder) in the order described, as disclosed in JP-A-5-58045. A thermal transfer sheet of this type is brought into contact with an image receiving sheet and imagewise irradiated with a laser beam. The irradiated area of the light-heat conversion layer generates heat to melt the image forming layer, and the molten part of the image forming layer is transferred to the image receiving sheet.

JP-A-6-219052 teaches a thermal transfer sheet comprising a substrate, a light-heat conversion layer containing a light-heat converting substance, a release layer as thin as 0.03 to 0.3 μm, and an image forming layer containing a colorant. According to this technique, the release layer reduces its bonding strength between the image forming layer and the light-heat conversion layer upon being irradiated with laser light. As a result, the image forming layer is allowed to be transferred to an image receiving sheet that has been brought into contact with the thermal transfer sheet to form a high precision transfer image. This image formation method utilizes laser ablation. That is, a laser-irradiated part of the release layer decomposes and vaporizes, resulting in reduction of the strength bonding the image forming layer and the light-heat conversion layer in that area. As a result, the image forming layer of that area is transferred to the image receiving sheet.

These imaging methods are advantageous in that images can be formed on printing paper having an image receiving layer (adhesive layer) and that a multicolor image can easily be obtained by successively transferring images of different colors onto the same image receiving sheet. The method utilizing ablation is particularly advantageous for ease of forming a highly precise image and is useful to prepare color proofs (DDCPs) or precise mask images.

With the spread of desk-top publishing (DPT) work, printing companies adopting a computer-to-plate (CTP) system have a strong demand for a DDCP system, which eliminates the need of intermediate film or plate output as has been involved in traditional analog proofing. In recent years, DDCPs with higher quality, higher stability, and larger sizes have been demanded as good approximations to the final prints.

Laser thermal transfer systems are capable of image formation at high resolution. Options include laser sublimation, laser ablation, and laser melt, each of which has the problem that the recorded dot shape is not sharp enough. The laser sublimation system is insufficient in approximation in color to the final print results because of use of dyes as coloring matter. Besides, this system involving dye sublimation results in blurred dot outlines, failing to achieve sufficiently high resolution. The laser ablation system, which uses pigments as coloring matter, provides a satisfactory approximation in color to the final printed products, but the dots are blurred, resulting in insufficient resolution similarly to the dye sublimation system because of the involvement of coloring matter scattering. The laser melt system also fails to create clear dot outlines because the molten colorant flows.

Where a heat transfer sheet the image forming layer of which has a thickness of 0.2 μm or greater is stored for a long time under severe conditions, a pigment dispersant that is not adsorbed onto pigment particles can migrate to the interface between the image forming layer and the light-heat conversion layer. It would follow that the adhesion between the image forming layer and the light-heat conversion layer is reduced, and non-irradiated area (non-image area) might be transferred to the image receiving layer to cause reduction in resolution.

Since the colors used in conventional heat transfer sheets are process colors (i.e., yellow, magenta, cyan, and black) and their combinations, reproducible hues have been so limited.

SUMMARY OF THE INVENTION

An object of the present invention is to provide a multicolor image forming material which exhibits excellent stability with time, maintains high resolution for an extended period of time, and achieves reproduction of a broadened range of hues and a multicolor image forming method using the same.

Another object of the invention is to provide a multicolor image forming material capable of providing a high quality, high stability, and large size DDCP serving as a good approximation to final printed products.

Still another object of the invention is to provide a multicolor image forming material which enables forming a high quality transfer image with a constant density on an image receiving sheet even when high-energy multibeams of laser light are used for heat transfer recording under different temperature and humidity conditions.

The above objects of the invention are accomplished by the following material and method for forming a multicolor image.

The present invention provides in its first aspect a multicolor image forming material comprising an image receiving sheet comprising an image receiving layer and at least five heat transfer sheets different in color each comprising a substrate having thereon a light-heat conversion layer and an image forming layer, each of the heat transfer sheets being adapted to be superposed on the image receiving sheet with the image forming layer facing the image receiving layer and irradiated with laser light to transfer the irradiated area of the image forming layer to the image receiving layer to form an image on the image receiving sheet, wherein:

the area of recording has a size of 515 mm by 728 mm or larger, the image forming layer of at least one of the heat transfer sheets has a thickness of 0.6 μm or greater, and the at least one of the heat transfer sheets has an adhesive strength of 8 g/cm or higher between the light-heat conversion layer and the image forming layer in the non-irradiated area thereof.

The present invention provides preferred embodiments of the multicolor image forming material, in which:

1) at least one of the heat transfer sheets contains a pigment as a colorant and a pigment dispersant in the image forming layer thereof, the proportion of the pigment dispersant that is not adsorbed on the pigment being 2.0% by weight or less based on the total solids content of the image forming layer;
2) the pigment dispersant is selected from the group consisting of a polymeric dispersant, a phosphoric ester compound, and a copper phthalocyanine sulfonic acid compound, the polymeric dispersant being a copolymer comprising (a) $(C_2H_5)_2N—(CH_2)_z—O—$ wherein z is 2 or 3, (b) ethylene glycol, and (c) propylene glycol at an (a):(b):(c) molar ratio of 1:10 to 20:25 to 40 or a polyblend containing the copolymer;
3) the image forming layer of at least one of the heat transfer sheets has an optical density to thickness ratio of 1.6 or higher, the thickness being expressed in micrometer;
4) the multicolor image forming material has a resolution of 2400 dpi or higher; or
5) the image forming layer of each of the heat transfer sheets and the image receiving layer of the image receiving sheet each have a water contact angle of 7.0 to 120.0°.

The present invention also provides in its second aspect a method for forming a multicolor image comprising the steps of superposing each of at least five heat transfer sheets according to the first aspect of the invention on an image receiving sheet according to the first aspect of the invention with the image forming layer facing the image receiving layer, imagewise irradiating the superposed heat transfer sheet with laser light, and transferring the irradiated area of the image forming layer to the image receiving layer sheet in the form of a thin film to record an image.

DETAILED DESCRIPTION OF THE INVENTION

Figure 1A:
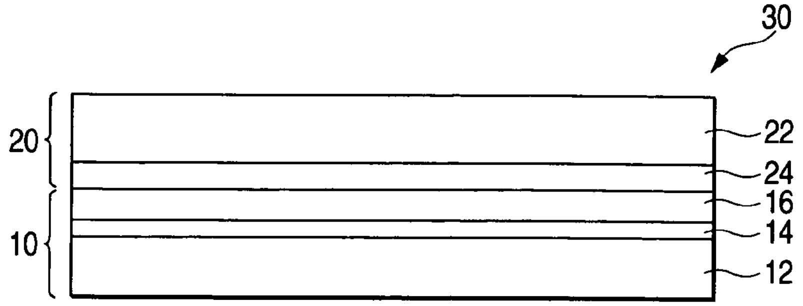
FIG. 1 (FIGS. 1A, 1B and 1C) shows a scheme for forming a multicolor image by thin film thermal transfer by laser beam.

The present inventors previously studied to provide DDCPs of B2/A2 or larger sizes and even of B1/A1 or larger sizes while retaining high image quality, high quality stability, and satisfactory approximation to an actual finished level. As a result, they developed a laser thermal transfer recording system for DDCP, which uses (a) an image forming element characterized by capability of image transfer to the same paper as printing paper, capability of outputting true halftone dots, use of pigments as a colorant, and large sizes of B2 or larger and (b) an output device combined with (c) high quality content management system (CMS) software. Performance features of the laser thermal transfer recording system developed by the inventors reside in (1) sharp dot formation, which offers a good approximation to final prints, (2) a satisfactory hue approximation to final prints, and (3) stable proof quality owing to performance stability against variations of the environment (i.e., temperature and humidity) and repetition.

From the aspect of material design, technical key points that allow this system to be developed are establishment of thin film transfer technology and improvements on the heat transfer elements' capability of being tightly held on a recording drum by suction, capability of high-resolution recording, and heat resistance. More specifically, the developed thermal transfer recording system has been realized by (i) introduction of an infrared absorbing colorant, which permits thickness reduction of a light-heat conversion layer, (ii) introduction of a high-Tg polymer, which enhances heat resistance of a light-heat conversion layer, (iii) introduction of a heat-resistant pigment, which leads to hue stabilization, (iv) addition of a low-molecular component, such as a wax and an inorganic pigment, which controls adhesion and cohesion, and (v) addition of a matting agent to a light-heat conversion layer, which ensures intimate contact to an image receiving sheet without causing image quality deterioration. From the aspect of apparatus design, on the other hand, technical key points that allow this system to be developed lie in (vi) an air ejection system adopted to a laser recording apparatus, with which a plurality of image receiving sheets having received an image can be stacked, (vii) the manner of inserting a sheet of printing paper and an image receiving sheet into a thermal transfer apparatus, in which the printing paper is superposed on the image receiving sheet placed with its image side up, which manner is effective to prevent the printing paper from curling after heat transfer, and (viii) connection to a general-purpose output drive which allows broadening of system configuration freedom. Thus, the laser thermal transfer recording system for DDCP the inventors developed is integration of various performance characteristics, system configuration, and the technical points. This recording system is an illustrative example of means for carrying out the image formation method of the invention, and the present invention is not deemed to be limited thereto.

Material factors such as combinations of image forming elements (i.e., heat transfer sheets and an image receiving sheet), constituent layer configurations (e.g., a light-heat conversion layer, an image forming layer, and an image receiving layer), formulation of each element, and the like are not to function dependently but to be organically linked with each other. Furthermore, these image forming elements are to play their best performance when linked with a recording apparatus and a thermal transfer apparatus. The present inventors have continued their study based on this concept. They have thoroughly examined each layer of the image forming elements (inclusive of the transfer sheet and the image receiving sheet) and materials making up the layers. They have designed layers making up image forming elements in which the materials are allowed to show their characteristics to the full. They have found proper ranges of various physical properties within which the image forming elements exert their full characteristics. As a result, the inventors have found out the best relations between physical properties and performance of the materials, layers, and sheets and succeeded in developing image forming elements which exhibit unexpectedly high performance when organically linked with a recording apparatus and a thermal transfer apparatus.

Significance of the present invention in the above-mentioned system developed by the inventors resides in offering a multicolor image forming material suited to the above-described system. The present invention is of high importance particularly in that heat transfer sheets exhibit high storage stability to maintain high resolution and capability of reproducing hues that have never been obtained with conventional process colors.

The multicolor image forming material comprises at least five color-specific heat transfer sheets different in color of their image forming layers. The at least five colors usually include process colors, i.e., yellow (Y), magenta (M), cyan (C) and black (K), and at least one of other arbitrary colors, preferably those which are impossible to reproduce with combinations of process colors, such as green (G), orange (O), red (R), blue (B), white (W), gold (Go), silver (S), and pink (P).

It is desirable that all of the heat transfer sheets satisfy the above-specified conditions as to the thickness of the image forming layer and the adhesive strength between the light-heat conversion layer and the image forming layer in the non-irradiated area. With the controlled thickness and adhesive strength of the image forming layer, the heat transfer sheet exhibits increased resolution and improved storage stability.

The thickness and adhesive strength of the image forming layer can be so controlled by, for example, proper adjustment of the amount of a pigment dispersant and/or proper selection of the pigment dispersant.

The amount of a pigment dispersant in the image forming layer is preferably such that the proportion of the pigment dispersant that is not adsorbed on pigment particles (hereinafter referred to as a free (pigment) dispersant) is 2.0% by weight or less, particularly 1.0% by weight or less, based on the total solids content of the image forming layer. With the amount of the free dispersant falling within the above-recited range, the amount of the free dispersant which may migrate to the image forming layer/light-heat conversion layer interface is reduced. This effect enables controlling the image forming layer/light-heat conversion layer interfacial adhesion within the range specified in the invention. As a result, the problem of undesired transfer of the non-irradiated area (i.e., the non-image area) to the image receiving layer is reduced, and a high resolution can be secured.

The amount of the free dispersant can be measured by NMR analysis of a supernatant liquid separated from a pigment dispersion by centrifugation. The terminology "total solids content" as used herein means the total non-volatile content of the image forming layer.

It is advisable that the pigment dispersant be chosen from those, when dispersed in a medium together with a pigment, adsorbable on the surface of pigment particles thereby to prevent re-agglomeration of the pigment particles and improve dispersibility of the pigment. These effects of pigment dispersants are produced through a mechanism that dispersant molecules adsorbed on pigment particles exert steric hindrance to each other to prevent pigment particles from approaching each other or a mechanism that charged molecules of a dispersant are adsorbed on pigment particles to form an electric double layer by which pigment particles are electrically prevented from approaching each other.

Pigment dispersants which are preferably used in the image forming layer include phosphoric ester compounds, copper phthalocyanine sulfonic acid compounds, polymeric dispersants, and mixtures thereof.

The phosphoric ester compounds include Disparlon PW36 available from Kusumoto Chemicals Ltd.

The copper phthalocyanine sulfonic acid compounds include Solsperse series (e.g., S-9000 and S-12000 available from ICI) which act as a synergist.

The polymeric dispersants include those having a weight average molecular weight of 5,000 to 100,000, preferably copolymers comprising (a) $(C_2H_5)_2N—(CH_2)_z—O—$ wherein z is an integer, (b) ethylene glycol, and (c) propylene glycol and polyblends containing the copolymer, still preferably copolymers comprising the units (a) wherein z is 2 or 3, (b) and (c) at an (a):(b):(c) molar ratio of 1:10 to 20:25 to 40 and polyblends containing the copolymer.

In the present invention at least five heat transfer sheets different in color of the image forming layer are used. In order to broaden the range of reproducible hues, the color or colors other than process colors is/are preferably selected from those outside the range reproducible with any one or more of conventional heat transfer sheets for yellow, magenta, cyan and black. The color of the heat transfer sheet serving to reproduce colors outside the range reproducible with any one or more of yellow, magenta, cyan, and black image forming layers preferably has a hue selected from the group consisting of (1) a hue having an L* value of 48 to 58, an a* value of 69 to 79, and a b* value of 36 to 46, (2) a hue having an L* value of 16 to 26, an a* value of 19 to 29, and a b* value of −63 to −73, (3) a hue having an L* value of 57 to 67, an a* value of −73 to −83, and a b* value of 26 to 36, and (4) a hue having an L* value of 65 to 75, an a* value of 50 to 60, and a b* value of 81 to 91. The L*, a*, and b* are values of CIE Lab color specification.

It is desirable for the image forming layer of the heat transfer sheet to have an optical density ($OD_I$) to thickness ($T_I$; unit: μm) ratio, $OD_I/T_I$, of 1.6 or higher, preferably 1.8 or higher, still preferably 2.50 or higher. The higher the ratio, the more desirable. Taking the balance with other characteristics into consideration, however, the upper limit of the ratio would be about 6 for the time being. The $OD_I/T_I$ is a measure of transfer image density of the image forming layer and the resolution of the transfer image. The $OD_I/T_I$ being in the recited range, a transfer image with a high density and a high resolution can be produced. A thinner image forming layer brings about increased color reproducibility.

The $OD_I$ refers to a reflection optical density of an image re-transferred from an image receiving sheet having received the image from the transfer sheet onto Tokubishi Art (printing paper available from Mitsubishi Paper Mills Ltd.), measured for each color (e.g., yellow (Y), magenta (M), cyan (C) or black (K)) with a densitometer X-rite 938 supplied by X-Rite. That is, the $OD_I$ of each of color-specific heat transfer sheets is the maximum density measured with, for example, a red filter for cyan, a blue filter for yellow, or a green filter for magenta. The $OD_I$ is preferably 0.5 to 3.0, still preferably 0.8 to 2.0.

It is preferred for the image forming layer of each heat transfer sheet and the image receiving layer of the image receiving sheet to have a water contact angle of 7.0 to 120.0°, particularly 30.0 to 100.0°. The water contact angle is a measure of compatibility between the image forming layer and the image receiving layer, namely, transfer capabilities. In particular, the water contact angle of the image receiving layer is desirably 86° C. or smaller. With the contact angles falling in the recited range, the image forming elements exhibit improved transfer sensitivity and reduced dependence of recording performance on environmental temperature and humidity. In the invention, the water contact angles are measured with a contact angle meter CA-A supplied by Kyowa Interface Science Co., Ltd.

The feature of the present invention consists in that a multicolor image can be formed over a larger recording area than in conventional techniques by controlling the physical properties of heat transfer sheets as described above. The multicolor image recording area achieved by the invention is 515 mm by 728 mm (B2 size) or larger, preferably 594 mm by 841 mm (A1 size) or larger. The size of the image receiving sheet is preferably 465 mm by 686 mm or larger.

It is desirable for the light-heat conversion layer of the heat transfer sheet to have an optical density ($OD_{LH}$) to thickness ($T_{LH}$; unit: μm) ratio, $OD_{LH}/T_{LH}$, of 4.36 or higher. The higher the ratio, the more preferred. Taking the balance with other characteristics into consideration, however, the upper limit of the ratio would be about 10 for the time being.

The $OD_{LH}$ of the heat transfer sheet refers to the absorbance of the light-heat conversion layer at the peak wavelength of laser light used for recording. The absorbance is measured with a known spectrophotometer. A UV spectrophotometer "UV-240" supplied by Shimadzu Corp. was used in the invention. The $OD_{LH}$ is obtained by subtracting the optical density of the substrate from that of the laminate composed of the substrate and the light-heat conversion layer.

The $OD_{LH}/T_{LH}$ relates to thermal conductivity in recording and is a measure greatly influential on the sensitivity and temperature- and humidity-dependence of recording. With the $OD_{LH}/T_{LH}$ falling within the above-recited preferred range, the sensitivity of transfer to the image receiving sheet is increased, and recording dependence on environmental temperature and humidity is reduced. Specifically, the $OD_{LH}/T_{LH}$ of 4.36or higher provides a transfer image at a high resolution preferably of 2400 dpi or more, still preferably of 2600 dpi or more, and over a wide area as referred to above.

The thickness $T_{LH}$ of the light-heat conversion layer is preferably 0.03 to 1.0 μm, still preferably 0.05 to 0.5 μm.

The light-heat conversion layer of at least one of the color-specific heat transfer sheets preferably comprises a polyamide-imide resin binder and a cyanine dye having a sulfonic acid group. A cyanine dye having a sulfonic acid group is characterized by high stability and insusceptibility to decomposition. It is also characterized by high affinity to polyamide-imide resins so that it is prevented from migrating into the image forming layer. A combined use of the polyamide-imide resin binder and the cyanine dye is effective in not only suppressing change in hue between before and after transfer to the image receiving sheet but assuring excellent stability of a coating composition for the light-heat conversion layer with time.

The system according to the present invention adopts a newly developed thin film thermal transfer system to accomplish high resolution and high image quality. The system is capable of producing a transfer image at a high resolution of 2400 dpi or more, preferably 2600 dpi or more. The thin film thermal transfer system is such that an image forming layer as thin as 0.01 to 0.9 μm is imagewise transferred to an image receiving sheet in the state not melted or hardly melted. In other words, the irradiated area of the image forming layer is transferred while keeping its shape as thin film so that an extremely high resolution is achieved. In order to carry out thin film transfer effectively, it is preferred that the light-heat conversion layer is thermally deformed into a dome shape on being irradiated. The dome-shaped light-heat conversion layer pushes the image forming layer outward, whereby the image forming layer is brought into more intimate contact with the image receiving layer and transferred thereto easily. Great deformation generates a great force pushing the image forming layer toward the image receiving layer and results in easy transfer. Small deformation produces only a small pushing force and fails to accomplish perfect transfer. Hence, the deformation should be quantified as a measure of transfer capabilities. In the invention, the degree of deformation is represented by a deformation percentage obtained by dividing the cross-sectional area (b) of the light-heat conversion layer before irradiated by the sum of the cross-sectional area (a) of the layer after irradiation and the cross-section area (b) and multiplying the quotient by 100. That is, deformation percentage (%)={(a+b)/(b)}×100. The cross-sectional areas (a) and (b) are measured with a color laser 3D profile microscope VK8500 supplied by Keyence Corp. A deformation percentage preferred for thin film transfer as contemplated in the invention is 110% or higher, preferably 125% or higher, still preferably 150% or higher. While the deformation percentage could exceed 250% as long as the heat-light conversion layer has an increased elongation at break, a preferred upper limit is usually about 250%.

The technical key points of image forming materials which can be applied to the thin film thermal transfer recording system are (1) balancing between high-temperature response and storage stability (adhesion), (2) securing of intimate and full contact between the heat transfer sheet and the receiving sheet, (3) use of heat-resistant organic materials, and (4) securing of surface cleanness, as hereinafter described.

(1) Balance Between High-temperature Response and Storage Stability

The image forming layer must have a small thickness on the order of submicrons in order to attain high image quality on transfer. However, the layer should contain a pigment in a high concentration enough to give a desired image density, which conflicts with fast thermal response. Besides, thermal response properties also conflict with storage (adhesion) stability. These conflicting problems are settled by development of novel polymers and additives.

(2) Vacuum Contact

In the thin film transfer technique in pursuit of high resolution, the transfer interface is desirably as smooth as possible. However, such surface smoothness interferes with sufficient vacuum contact. In the present invention, departing from the common knowledge relating to vacuum contact, a relatively large amount of a matting agent having a relatively small particle size is incorporated into a layer between the substrate and the image forming layer thereby to maintain a moderate uniform gap between the transfer sheet and the receiving sheet. As a result, vacuum contact capabilities are achieved without allowing the matting agent to cause dot missing and without ruining the advantages of the thin film transfer technology.

(3) Heat-resistant Organic Materials

On irradiation, the light-heat conversion layer which converts laser light energy to heat energy reaches about 700° C., and the image forming layer containing a pigment reaches about 500° C. The inventors have developed a binder resin capable of being applied by solvent coating techniques as a material of the light-heat conversion layer. They have also developed a pigment as a colorant of the image forming layer which is more heat-resistant than pigments for printing, safe, and fit for color matching.

(4) Surface Cleanness

Debris or dust present between the transfer sheet and the receiving sheet leads to serious image defects in thin film transfer. To keep the image forming elements clean, material management alone is insufficient because dust outside the equipment can enter or dust can occur during sheet cutting operation. It has therefore been necessary to fit the equipment with a dust removing mechanism. The inventors have found a material with moderate tackiness with which the surface of the image forming elements can be cleaned. They have thus succeeded in dust removal without accompanying productivity reduction by using sheet feed rollers made of this material.

The whole system according to the invention will hereinafter be described. The present invention is contemplated to produce a heat transfer image of sharp dots, to re-transfer the transfer image to stock paper (paper actually used in printing), and to achieve recording over a wide area.

One of the performance features of the system developed by the inventors is capability of forming sharp dots. The resolution achievable with this system is 2400 dpi or higher, and a transfer image having a resolution according to a desired number of lines per inch (lpi) can be obtained by the system. The individual dots have very sharp edges substantially free from blur or deficiency. Full range of dots from highlights to shadows can be formed clearly. Therefore, the system is capable of outputting high quality dots at the same level of resolution as obtained with an image setter or a CTP setter to give an approximation to dots and gradation of final printed products.

A second performance feature of the system is satisfactory cyclic reproducibility (repeatability). Since the image forming layer can be transferred in sharp dots, dots are reproduced in good agreement with a laser beam. Additionally, because of very small environmental dependency of recording characteristics, the results of repetition are stable in hue and density in a wide range of environmental conditions.

A third performance feature of the system is satisfactory color reproducibility. Since the system employs the same pigments as used in printing inks and has satisfactory cyclic reproducibility, highly accurate color management system (CMS) can be realized.

The heat transfer image obtained substantially matches the color hues of final prints, i.e., the hues of SWOP (specifications for web offset publications) colors or Japan-colors and shows the same change in what it looks like with a change of lighting (e.g., a fluorescent lamp and an incandescent lamp) as the final printed product.

A fourth performance feature of the system is satisfactory text quality. Owing to the sharp dot shape, the system reproduces fine lines of letters with sharp edges.

The material technology adopted to the laser thermal transfer recording system of the invention is then described. Thermal transfer techniques for DDCP include laser sublimation, laser ablation, and laser melt. The laser sublimation system and the laser ablation system result in blurred dot edges because of sublimation or scattering of a colorant. The laser melt system also fails to create clear dot outlines because the molten colorant flows. The system according to the invention adopts the thin film thermal transfer system. In order to solve problems associated with the thin film thermal transfer system and to further improve the transfer image quality, the following material techniques have been added.

A first material feature of the system is a sharper dot edge. In thermal transfer recording, laser light is converted to heat in the light-heat conversion layer, the heat is transmitted to the adjoining image forming layer, and the image forming layer adheres to the image receiving layer to conduct recording. In order to make sharp dots, it is required that the heat generated by laser light be transmitted right to the transfer interface without being diffused in the planar direction so that the image forming layer may be cut sharply along the borders between heated areas and non-heated areas. For this purpose, the light-heat conversion layer of the heat transfer sheet should be reduced in thickness, and the dynamic characteristics of the image forming layer should be so controlled.

Accordingly, a first technique for accomplishing dot sharpening is thickness reduction of the light-heat conversion layer. As simulated, a light-heat conversion layer is assumed to instantaneously reach about 700° C. so that a thin light-heat conversion layer is liable to deformation or destruction. A deformed or destroyed thin light-heat conversion layer would be transferred to an image receiving sheet together with an image receiving layer or result in an uneven transfer image. Beside this problem, a light-heat conversion layer must have a light-heat converting substance in a high concentration so as to reach a prescribed temperature, which can cause additional problems such as colorant's precipitation or migration to an adjacent layer. To address these problems, the heat transfer sheet of the invention employs an infrared absorbing colorant as a light-heat converting substance which is effective at a reduced amount compared with carbon that has been often used as a light-heat converting substance. With respect to a binder, a resin which retains sufficient mechanical strength even at high temperatures and has satisfactory ability to hold an infrared absorbing colorant is selected.

In this way, it is preferred to reduce the light-heat conversion layer thickness to about 0.5 μm or smaller by selecting an infrared absorbing colorant exhibiting excellent light-heat conversion characteristics and a heat-resistant binder such as a polyamide-imide resin.

The combined use of the infrared absorbing colorant and the polyamide-imide resin in the light-heat conversion layer produces the following effects. The storage stability of a coating composition for light-heat conversion layer is improved thereby to prevent reduction in absorbance of the light-heat conversion layer that might occur due to storage of the coating composition. The absorbance of the light-heat conversion layer is increased, which leads to improved sensitivity. Change in hue between before and after irradiation is reduced to improve light resistance.

A second technique for dot sharpening is for improving the characteristics of the image forming layer. If the light-heat conversion layer is deformed, or if the image forming layer itself undergoes deformation due to high heat, the image forming layer transferred to the image receiving layer suffers from thickness unevenness in response to the slow scanning pattern of a laser beam. It follows that the transfer image becomes non-uniform with reduced apparent transfer densities. This tendency becomes conspicuous with a decrease in image forming layer thickness. On the other hand, a thick image forming layer has poor dot sharpness and reduced sensitivity.

In order to solve these problems, it is preferred to reduce transfer unevenness by adding a low-melting substance, such as a wax, to the image forming layer. Furthermore, fine inorganic particles can be added in place of part of binders to increase the layer thickness to a proper degree so that the image forming layer may be sharply cut along the heated area/non-heated area interface. As a result, uniform recording can be accomplished without impairing dot sharpness and sensitivity.

In general, low-melting substances such as waxes tend to bleed on the surface of the image forming layer or to crystallize, which can result in impairment of image quality or deterioration of stability of the heat transfer sheet with time. To address this drawback, it is preferred to select a low-melting substance with a small difference in Sp (solubility parameter) value from the polymer of the image forming layer. Such a substance exhibits improved compatibility with the polymer and is prevented from releasing from the image forming layer. It is also preferred for averting crystallization that a plurality of low-melting substances having different structures are mixed into an eutectic mixture. By these manipulations an image of sharp dots free from unevenness can be obtained.

A second material feature of the system owes to the finding that thermal transfer recording sensitivity is dependent on temperature and humidity. In general, the heat transfer sheet changes its mechanical and thermal characteristics on moisture absorption, which means environmental humidity dependence of recording. In order to reduce the temperature and humidity dependence, it is preferred that the colorant/binder system of the light-heat conversion layer and the binder system of the image forming layer be of an organic solvent system. It is also preferred to choose polyvinyl butyral as a binder of the image receiving layer and to introduce a polymer hydrophobilization technique for reducing the water absorption of polyvinyl butyral. Available polymer hydrophobilization techniques include causing a hydroxyl group of a polymer to react with a hydrophobic group as taught in JP-A-8-238858 and crosslinking two or more hydroxyl groups of a polymer with a hardening agent.

A third material feature of the system lies in improvement on hue approximation to the final output. The system of the invention has introduced the knowledge about color matching management and stable dispersing technique amassed through the development of a thermal head type color proofer (e.g., First Proof supplied by Fuji Photo Film Co., Ltd.) and also settled the following problem that has arisen in the laser thermal transfer system.

A first technique for achieving improved hue approximation to the final output consists in use of a highly heat-resistant pigment. An image forming layer generally reaches about 500° C. in thermal transfer recording by laser light. Some of traditionally employed pigments decompose at such high temperatures. This problem is averted by using highly heat-resistant pigments in the image forming layer.

A second technique realizing improved hue approximation to the final output resides in prevention of the infrared absorbing colorant from diffusing. If the infrared absorbing colorant used in the light-heat conversion layer migrates to the image forming layer due to the high recording heat, it follows that the hue of a resultant transfer image differs from what is expected. To prevent this, the light-heat conversion layer is preferably made of the infrared absorbing colorant combined with the above-described binder capable of securely holding the infrared absorbing colorant.

A fourth material feature of the system is achievement of high sensitivity. In high-speed recording with laser light, shortage of light energy often occurs to cause gaps, particularly gaps corresponding to the scanning pitch in the slow scanning direction. To address the problem, the high concentration of a colorant (pigment) in the light-heat conversion layer and the small thicknesses of the light-heat conversion layer and the image forming layer serve to increase the efficiency of heat generation and heat conduction as previously stated. Additionally, it is preferred to incorporate a low-melting substance into the image forming layer. By so doing, the image forming layer is made capable of flowing slightly to such an extent as to fill the gaps, and the adhesion of the image forming layer to the image receiving layer is improved. It is also preferred to use polyvinyl butyral, which is a preferred binder for use in the image forming layer, as a binder of the image receiving layer so as to increase the adhesion between the image receiving layer and the image forming layer and to ensure the film strength of the transfer image.

A fifth material feature of the system is improvement on vacuum holding. The image receiving sheet and the heat transfer sheet are preferably held on a recording drum by vacuum holding. The contact of the two sheets by vacuum holding is of great significance because image transfer relies on control of adhesion between the image receiving layer of the image receiving sheet and the image forming layer of the transfer sheet, and the transfer behavior is very sensitive to the clearance therebetween. An increased gap between the two sheets due to dust or debris results in image defects or transfer unevenness. To prevent such image defects and transfer unevenness, it is preferred to give uniform surface roughness to the heat transfer sheet thereby allowing entrapped air to escape to make a uniform clearance between the two sheets.

Surface roughness is given to the heat transfer sheet side so that the effect of vacuum contact may be fully enjoyed when two or more color images are overprinted. The heat transfer sheet can be textured by post-treatments such as embossing or addition of a matting agent. Addition of a matting agent is preferred for the sake of process simplification and in view of material stability with time. A matting agent to be added should have a particle size larger than the thickness of a layer to which it is added. Addition of a matting agent directly to the image forming layer would result in missing of dots from the part where the matting agent particles stick out. This is the reason why a matting agent of optimum particle size is preferably added to the light-heat conversion layer. As a result, the image forming layer provided thereon has an almost uniform thickness and is capable of transferring a defect-free image to the image receiving sheet.

The systematization of the technique according to the present invention will then be described.

A first feature of the systematization is configuration of the recording apparatus. In order to duly reproduce sharp dots, not only the image forming elements but also the recording apparatus should be designed precisely. The recording apparatus which can be used has the same basic configuration as conventional thermal transfer recorders. This configuration is a so-called heat mode outer drum recording system in which a heat transfer sheet and an image receiving sheet held on a drum are irradiated with a recording head having a plurality of high power lasers. The following embodiments are preferred among others.

Firstly, the recording apparatus is designed to avoid contamination with dust. The image receiving sheet and the heat transfer sheet are supplied by a full-automatic roll supply system so as to avoid contamination with dust or debris that might enter if the recording apparatus is manually loaded with a stack of cut sheets. A loading unit containing rolls of the heat transfer sheets of different colors, one roll for one color, rotates to bring each roll to the position where the unrolled continuous sheet is cut at a prescribed length with a cutter, and the cut sheet is held onto a recording drum.

Secondly, the recording apparatus is designed to bring the image receiving sheet and the heat transfer sheet into intimate contact on the recording drum. The image receiving sheet and the heat transfer sheet are held to the drum by suction (vacuum holding). Mechanical holding fails to bring the two sheets into such intimate contact as obtained by vacuum holding. A large number of suction holes are formed on the recording drum, and the inside of the drum is evacuated with a blower or a vacuum pump thereby to hold the sheets onto the drum. The image receiving sheet is the first to be held by suction, and the heat transfer sheet is superposed thereon. Therefore, the heat transfer sheet is made larger than the image receiving sheet so as to have extensions over every side of the image receiving sheet. Air between the heat transfer sheet and the image receiving sheet, which greatly influences the image transfer, is sucked from the extension area of the heat transfer sheet extending from the underlying image receiving sheet.

Thirdly, the recording apparatus is designed to allow a plurality of output sheets to be stacked stably on an output tray. In the present invention, the recording apparatus is contemplated to provide output sheets of B2 or larger sizes being stacked on the output tray. When a sheet is outputted and superposed on another sheet that has already been discharged, the two sheets can stick to each other because of the heat stickiness of the image receiving layer. If this happens, the next sheet is not discharged in good order to cause jamming. To prevent this from happening, it is the best to prevent the output sheets from coming into contact with each other. Known means for preventing the contact include (a) a level difference made on the output tray, by which the sheet is placed non-flat, and a gap is created between adjacent sheets, (b) a slot for output exit positioned higher than the output tray so that an output sheet discharged through the slot drops on the output tray, and (c) air ejected between adjacent sheets to float the upper sheet. Since the sheet size is as large as B2, application of the means (a) or (b) will make the apparatus considerably larger. Therefore, the means (c), i.e., an air ejection method is employed in this system.

Figure 2:
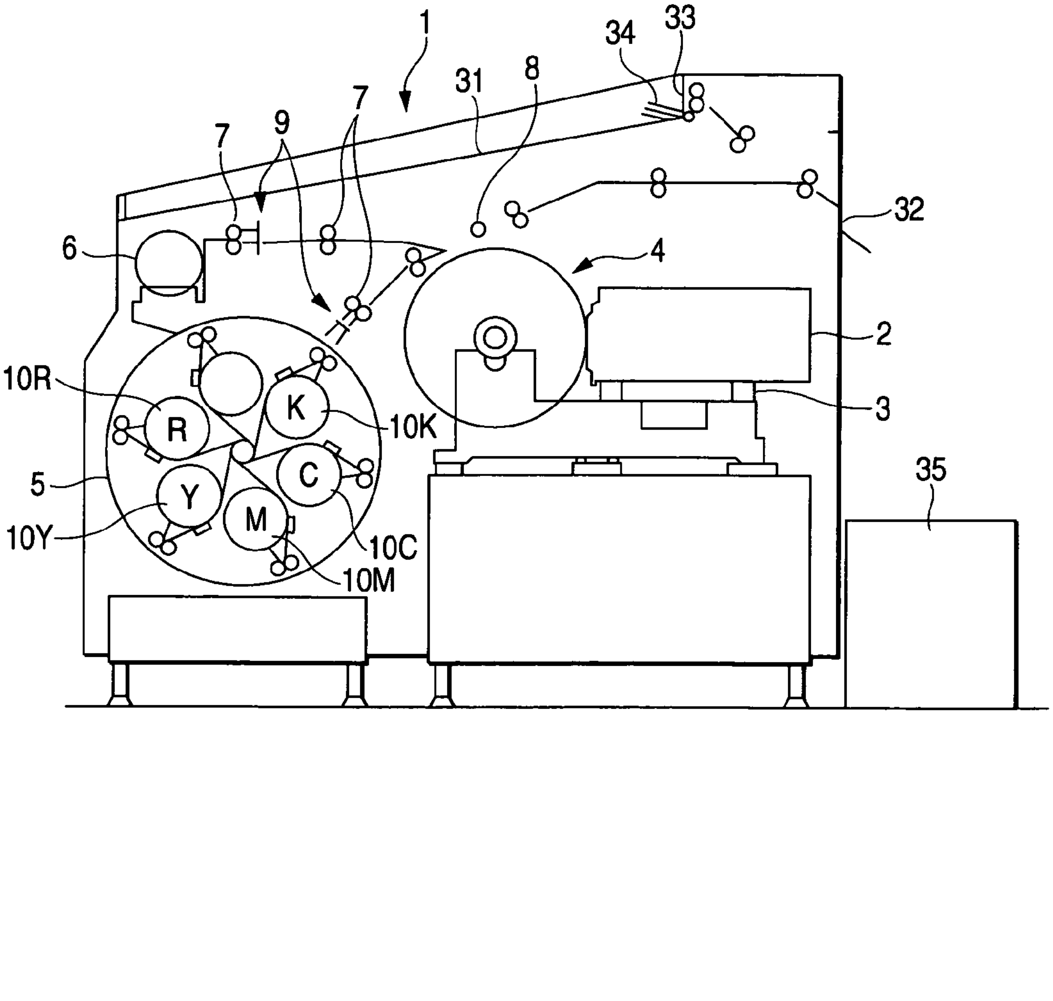
FIG. 2 shows a configuration of a laser thermal transfer recording apparatus.

FIG. 2 shows a recording apparatus 1 as an example of the recording apparatus which can be used in the invention.

Referring to FIG. 2, steps for full color image formation by use of the image forming material according to the invention and the above-described recording apparatus are illustrated below in sequence.

1) A recording head 2 which slides on rails 3 in the slow scan (sub-scan) direction, a recording drum 4 which rotates in the fast scan (main scan) direction, and a heat transfer sheet loading unit 5 return to their starting positions.

2) An image receiving sheet is unrolled from an image receiving sheet roll 6 with feed rollers 7, and the leading end of the image receiving sheet is fixed by suction onto the recording drum 4 through suction holes of the recording drum.

3) A squeeze roller 8 comes down and presses the leading end of the image receiving sheet onto the recording drum 4. In this state, the drum 4 rotates to further unroll the image receiving sheet. When a given length is unrolled, the drum stop rotating, and a cutter 9 cuts the unrolled sheet.

4) The recording drum 4 further turns to makes one revolution to complete image receiving sheet loading.

5) A heat transfer sheet of the first color, e.g., black (K), is unrolled from a heat transfer sheet roll 10K, held onto the recording drum 4, and cut into a sheet of prescribed length according to the same sequence as for the image receiving sheet.

6) The recording drum 4 starts to rotate at high speed, and the recording head 2 starts to move on the rails 3. When the recording head 2 arrives at a record starting position, it emits writing laser beams to irradiate the transfer material (heat transfer sheet and the image receiving sheet) held on the recording drum 4 according to recording signals. The irradiation is stopped at a recording terminal position, and the operations of the rails 3 and the drum 4 stop. The recording head 2 on the rails 3 returns to its starting position.

7) Only the heat transfer sheet K is peeled off with the image receiving sheet left on the recording drum. The leading end of the heat transfer sheet K is caught in claws, pulled apart from the image receiving sheet, and discarded through a discard slot 32 into a waste box 35.

8) The steps (5) to (7) are repeated for each of the other heat transfer sheets. Recording is performed in the order of, for example, black (K), cyan (C), magenta (M), yellow (Y), and red (R), and optionally blue (B), orange (O), etc. That is, for example, a heat transfer sheet of the second color (C), a heat transfer sheet of the third color (M), a heat transfer sheet of the fourth color (Y), and a heat transfer sheet of the fifth color (R) are successively fed from rolls 10C, 10M, 10Y, and 10W, respectively. The order of color superimposition in the recording apparatus is the reverse of the general printing order because the resulting color image is reversed on re-transfer to paper to give a color proof. The order of color superimposition is not particularly limited.

9) After completion of the above steps, the recorded image receiving sheet is discharged on an output tray 31. The image receiving sheet is separated from the recording drum in the same manner as for the heat transfer sheets (as described in step (7)) but is not discarded. When it comes near the discard slot 32, it changes its direction by a switchback mechanism and is forwarded to the output tray. When the image receiving sheet exits through the discharge slot 33, air 34 is blown from under the slot 33 to allow a plurality of sheets to be stacked without sticking to each other.

It is preferred to use an adhesive roller as one of paired feed rollers 7 disposed on any site between the recording drum 4 and each of the image receiving sheet roll and the heat transfer sheet roll to clean the surface of the heat transfer sheet and the image receiving sheet.

The adhesive roller has a pressure-sensitive adhesive on its surface. The pressure-sensitive adhesive includes an ethylene-vinyl acetate copolymer, an ethylene-ethyl acrylate copolymer, a polyolefin resin, a polybutadiene resin, a styrene-butadiene copolymer (SBR), a styrene-ethylene-butene-styrene copolymer (SEBS), an acrylonitrile-butadiene copolymer (NBR), a polyisoprene resin (IR), a styrene-isoprene copolymer (SIS), an acrylic ester copolymer, a polyester resin, a polyurethane resin, an acrylic resin, butyl rubber, and polynorbornene.

The surface of the heat transfer sheet and the image receiving sheet can be cleaned on contact with the adhesive roller. The contact pressure is not particular limited.

It is preferred that the pressure-sensitive adhesive used in the adhesive roller has a Vickers hardness Hv of 50 $kg/mm^2$ (≈490 MPa) or less for thoroughly removing dust and thereby preventing image defects caused by dust. "Vickers hardness" is a hardness measured by applying a static load to a quadrilateral diamond indenter having an angle of 136° between the opposite faces. Vickers hardness Hv is obtained from equation:

$$Hv=1.854P/d^2(\text{kg/mm}^2)\approx 18.1692P/d^2(\text{MPa})$$

where P is a load (kg) applied, and d is the length (mm) of a diagonal of a square indentation.

It is also preferred for the pressure-sensitive adhesive to have an elastic modulus of 200 $kg/cm^2$ (≈19.6 MPa) or less at 20° C. for the same purpose as described above.

A second feature of the systematization is configuration of a heat transfer apparatus. A heat transfer apparatus is used to carry out the step of re-transferring the transfer image on the image receiving sheet to a sheet of the same paper as used in final printing (hereinafter simply referred to as a paper sheet). This step is entirely identical to that carried out in First Proof (a trade mark of a thermal transfer apparatus available from Fuji Photo Film Co., Ltd.). A paper sheet is superposed on the image receiving sheet, and heat and pressure are applied thereto to adhere the two sheets together. Then, the image receiving sheet is stripped off the paper sheet, whereby only the substrate and a cushioning layer (if provided as hereinafter described) of the image receiving sheet are removed to leave the image and the image receiving layer on the paper sheet. This practically means that the image is transferred from the image receiving sheet to the printing paper sheet.

In First Proof™, image re-transfer is performed by superposing a paper sheet and the image-receiving sheet on an aluminum guide plate and passing them through a pair of heat rollers. The aluminum guide plate serves to prevent the paper from deformation. If this design is applied as such to the system for B2 size output, the aluminum guide plate should be larger than a B2 size, which results in the problem that a large installation space is required. Accordingly, the system of the present invention does not use such an aluminum guide plate. Instead, the carrier path turns 180° so that the sheets are discharged toward the loading side. As a result, the installation space can be largely saved (see FIG. 3). However, there arises another problem that the paper sheet is curled in the absence of an aluminum guide plate. The facing couple of the paper sheet and the image-receiving sheet curls with the image-receiving sheet inward and rolls on the output tray. It is very difficult to separate the image receiving sheet from the curled paper.

In the present invention, this curling phenomenon is averted by taking advantage of bimetallic effect due to the difference in shrinkage between printing paper and the image receiving sheet and the ironing effect of the heat roller. Where an image receiving sheet is superposed on a paper sheet as in a conventional way, the two sheets curl with the image receiving sheet inward by bimetallic effect upon heating because the image receiving sheet shows larger thermal shrinkage in the direction of insertion than printing paper. The direction of curling by the bimetallic effect is the same as the direction of curling by the ironing effect of the heat roller around which the two sheets are wound. As a result, the curling becomes serious by synergism. In contrast, when the paper sheet is superposed on an image receiving sheet, downward curling by the bimetallic effect occurs whereas upward curling is caused by ironing effect so that the curls of opposite directions are offset by each other.

Figure 3:
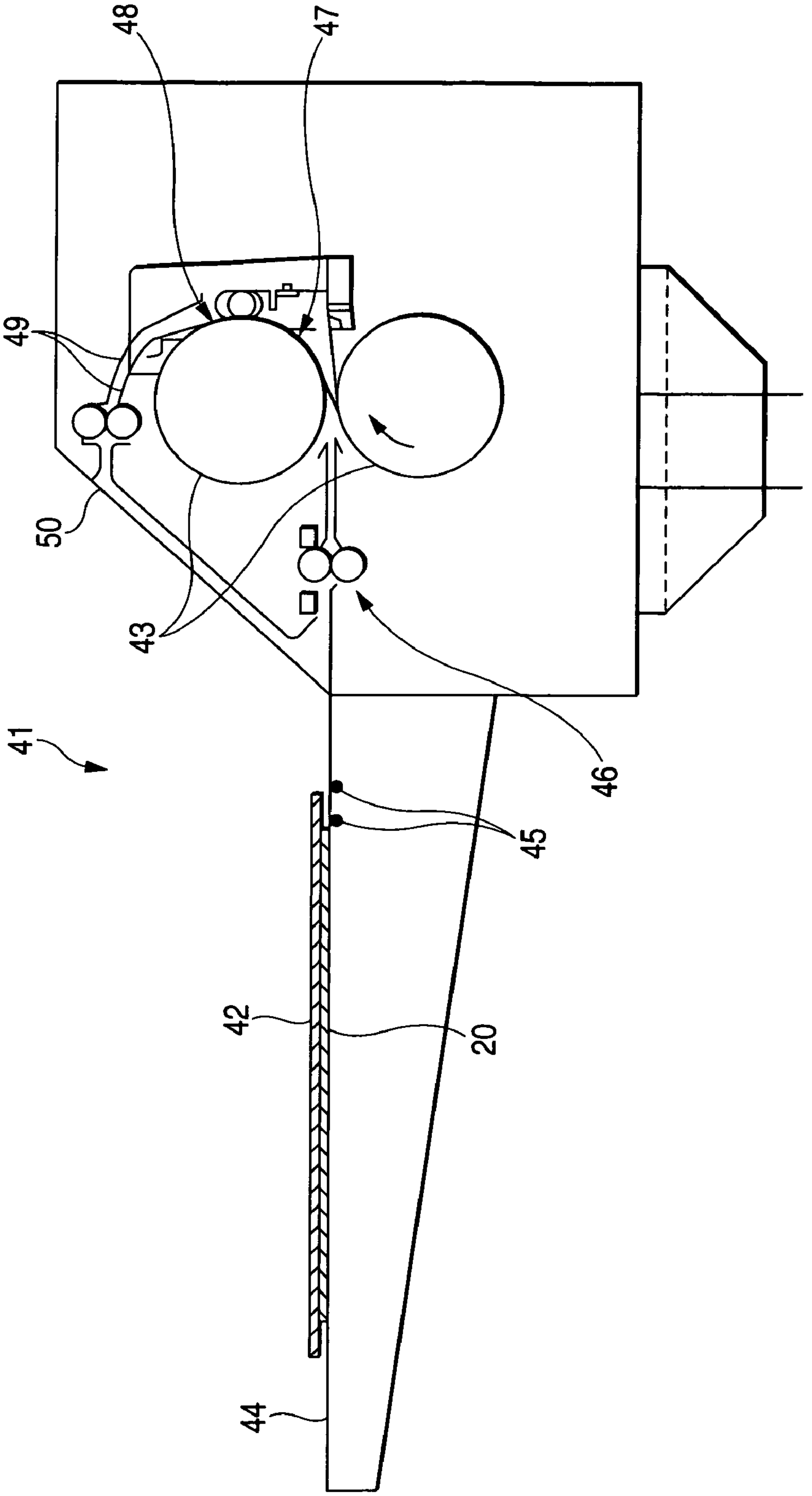
FIG. 3 shows a configuration of a thermal transfer apparatus.

Re-transfer to printing paper is carried out according to the following sequence. A thermal transfer apparatus 41 which can be used for re-transfer is shown in FIG. 3. Unlike the laser recording apparatus, the thermal transfer apparatus 41 is manually operated.

1) To begin with, dials (not shown) are turned to set the temperature of heat rollers 43 (variable between 100° and 110° C.) and the transfer speed according to the kind of printing paper 42.
2) An image receiving sheet 20 is put on an insertion table 44 with the image side up, and the dust on the image is removed by an antistatic brush (not shown). A paper sheet 42 from which dust has been removed is superposed thereon. Because the upper paper sheet 42 is larger than the lower image receiving sheet 20, it is difficult to position the paper sheet 42 on the image receiving sheet 20 hidden from the eye. For improving the ease of the positioning work, marks 45 indicating the positions of placement for an image receiving sheet 20 and a paper sheet 45 are made on the insertion table 44. The reason the paper sheet is larger than the image-receiving sheet 20 is to prevent image receiving sheet 20 from coming out under the paper sheet 42 and staining heat roller 43.
3) The image receiving sheet and the paper sheet are inserted into an insert port, and a pair of insert rollers 46 rotates to feed them to heat rollers 43.
4) When the leading end of the paper sheet 42 reaches the heat rollers 43, the heat rollers nip the two sheets to start heat transfer. The heat rollers are heat resisting silicone rubber rollers. Pressure and heat are applied simultaneously to the image receiving sheet and the paper sheet to adhere them. A heat-resistant guide sheet 47 is provided by the upper heat roller. The image receiving sheet and the paper sheet are carried upward through between the upper heat roller and the guide sheet 47 while being heated, separated from the upper heat roller by separation claw 48, and guided to an output slot 50 along a pair of guide plates 49.
5) The image receiving sheet and the paper sheet coming out of the output slot 50 is discharged on the insertion table while being adhered. Thereafter, the image receiving sheet 20 is separated from the paper sheet 42 manually.

The third feature of the systematization technique resides in the system configuration.

Figure 4:
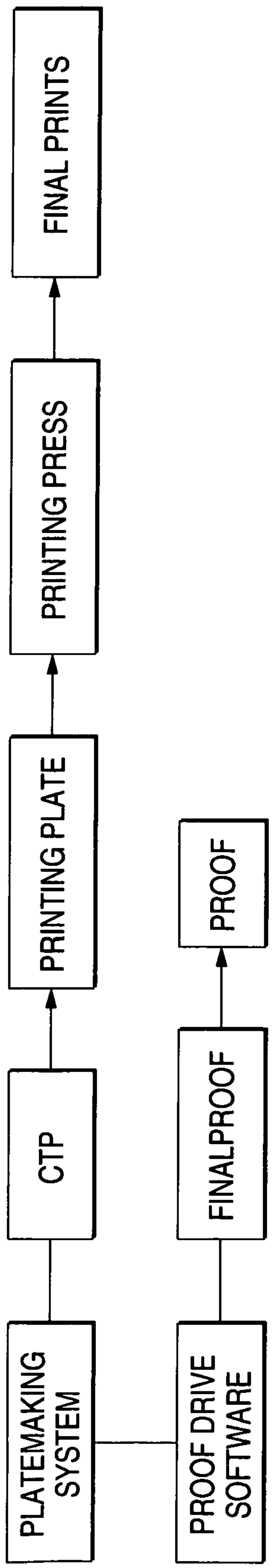
FIG. 4 shows a system configuration including laser thermal transfer recording apparatus FINALPROOF.

The above-illustrated apparatus are connected to a plate-making system to perform the function as a color proofer. A color proofing system is required to output a color proof as an approximation to final prints outputted based on certain page data. Therefore, software for approximating dots and colors to the final prints is necessary. A specific example of connection is shown below. FIG. 4 is referred to.

When a proof is to be prepared for the final printing product outputted from a plate-making system Celebra™ (from Fuji Photo Film Co., Ltd.), a CTP system is connected to Celebra. A printing plate outputted from this connection is mounted on a press to carry out actual printing. To Celebra is connected the above-illustrated thermal transfer recording apparatus as a color proofer, e.g., Luxel FINALPROOF 5600 from Fuji Photo Film Co., Ltd. (hereinafter simply referred to as FINALPROOF), and proof drive software PD SYSTEM™ available from Fuji Photo Film is installed between Celebra and FINALPROOF for approximating dots and colors to the final output.

Contone data (continuous tone data) converted to raster data by Celebra are converted to binary data for dots, outputted to the CTP system, and finally printed. On the other hand, the same contone data are also sent to PD SYSTEM. PD SYSTEM converts the received data according to a multi-dimensional table for each color so that the colors may agree with the final output. Finally the data are converted to binary data for dots so as to agree with the dots of the final output, which are sent to FINALPROOF.

The multi-dimensional table for each color is experimentally prepared in advance and stored in the system. The experiment for the preparation of the multi-dimensional table is as follows. Date of an important color are outputted via the CTP system to prepare a printed image. The same data are also outputted from FINALPROOF via PD SYSTEM to prepare a proof image. The measured color values of these images are compared, and a table is prepared so as to minimize the difference.

Thus, the system configuration is set up so that the performance of the high-resolution image forming elements of the invention may be exhibited to the full.

The heat transfer sheet suitably used in the above-described system is then described.

It is preferred that the absolute value of the difference in surface roughness Rz (defined later) between the exterior and the interior sides of the image forming layer of the heat transfer sheet be 3.0 μm or smaller and that the absolute value of the difference in surface roughness Rz between the exterior and the interior sides of the image-receiving layer of the image receiving sheet be 3.0 μm or smaller. Such a layer design combined with the above-described cleaning means prevents image defects and jamming in the sheet path and reduces variations in dot gain.

The surface roughness Rz is a 10 point height parameter corresponding to the Rz (maximum height) specified in JIS B 0601. The surface roughness Rz is obtained by computing the average height difference between the five highest peaks and the five lowest valleys with respect to the mean plane within an evaluation area. A stylus type 3D roughness meter (Surfcom 570A-3DF, available from Tokyo Seimitsu Co., Ltd.) is used for measurement. The measurement is performed in the longitudinal direction, the cut-off length is 0.08 mm, the evaluation area is 0.6 mm by 0.4 mm, the sampling pitch is 0.005 mm, and the speed of measurement is 0.12 mm/sec.

For enhancing the above-described effects, it is still preferred that the absolute difference in Rz between the exterior and the interior surfaces of the image forming layer be 1.0 μm or smaller and that the absolute difference in Rz between the exterior and the interior sides of the image receiving layer be 1.0 μm or smaller.

In another layer design, it is preferred that the surface roughness Rz of both the exterior and the interior sides of the image forming layer of the heat transfer sheet and/or both the exterior and the interior sides of the image receiving layer of the image receiving sheet be in a range of from 2 to 30 μm. Such a layer design combined with the above-described cleaning means prevents image defects and jamming in the sheet path and reduces variations in dot gain.

It is preferred for the image forming layer of each heat transfer sheet to have a gloss of 80 to 99. The gloss of the image forming layer largely depends on the smoothness of the layer and relates to the thickness uniformity of the layer. An image forming layer with a higher gloss has higher thickness uniformity and is more suited for high precision image formation. However, higher smoothness leads to higher resistance in sheet transportation. Where the surface gloss ranges 80 to 99, a balance between smoothness and transportation resistance will be achieved.

The scheme of multicolor image formation by thin film thermal transfer using a laser is described by referring to FIG. 1.

Figure 1B:
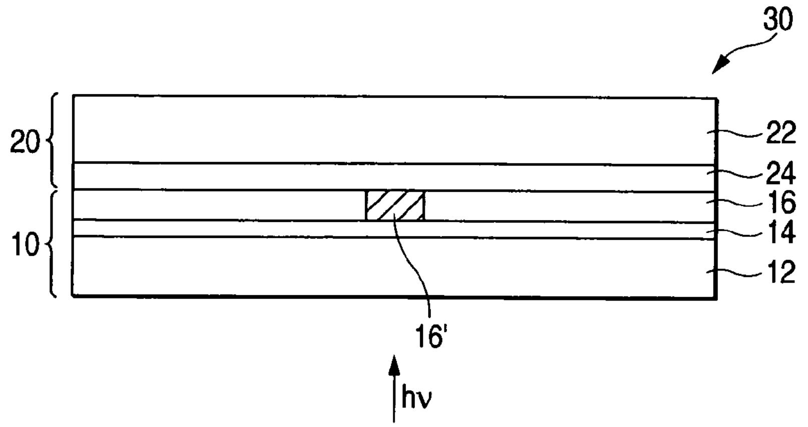
Figure 1C:
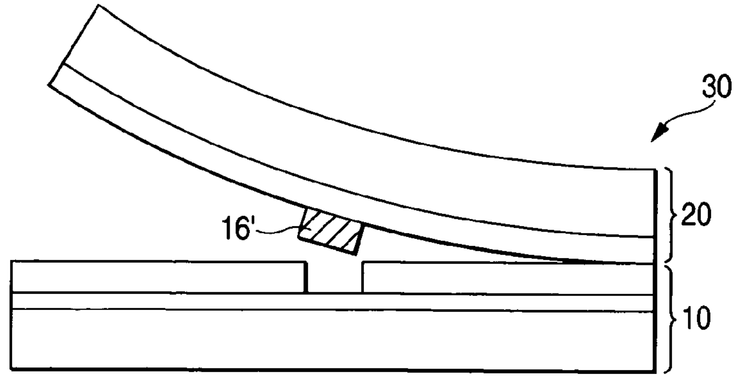

An image forming laminate 30 composed of a heat transfer sheet 10 and an image receiving sheet 20 is prepared (see FIG. 1A). The heat transfer sheet 10 comprises a substrate 12, a light-heat conversion layer 14 provided on the substrate 12, and an image forming layer 16 containing a pigment (black (K), cyan (C), magenta (M), yellow (Y), etc.) provided on the light-heat conversion layer 14. The image receiving sheet 20 has a substrate 22 and an image receiving layer 24. The two sheets 10 and 20 are superposed with the image receiving layer 24 facing the image forming layer 16. On imagewise irradiating the laminate 30 with a laser beam from the side of the substrate 12 of the heat transfer sheet 10 in a time series, the irradiated area of the light-heat conversion layer 14 of the heat transfer sheet 10 generates heat to reduce its adhesion to the image forming layer 16 (see FIG. 1B). The heat transfer sheet 10 is stripped off the image receiving sheet 20 while leaving the irradiated area 16' of the image forming layer 16 on the image receiving layer 24 of the image receiving sheet 20. That is, the image is transferred (see FIG. 1C).

In multicolor image formation, the laser light for imagewise irradiation preferably comprises multibeams, particularly multibeams of two-dimensional array. Multibeams of two-dimensional array are a plurality of laser beams arranged in a two-dimensional array such that the spots of these laser beams form a plurality of lines in the fast scan direction and a plurality of rows in the slow scan direction. Use of multibeams in a two-dimensional array reduces the time required for laser recording.

Laser beam of any kind can be used in recording with no limitation, including direct laser beams such as gas laser beams, e.g., an argon ion laser beam, a helium neon laser beam, and a helium cadmium laser beam, solid state laser beams, e.g., a YAG laser beam, a semiconductor laser beam, a dye laser beam, and an excimer laser beam. Light rays obtained by converting these laser beams to half the wavelength through a second harmonic generation device can also be used. Semiconductor laser beams are preferably used taking the output power and ease of modulation into consideration. A laser beam is preferably emitted to give a spot diameter of 5 to 50 μm, particularly 6 to 30 μm, on the light-heat conversion layer. The scanning speed is preferably 1 m/sec or higher, still preferably 3 m/sec or higher.

The thickness of the black image forming layer in the black heat transfer sheet is preferably larger than that of the other image forming layers of the other heat transfer sheets (e.g., yellow, magenta, cyan, etc.) and preferably ranges from 0.5 to 0.7 μm. This layer design is effective to prevent density reduction due to non-uniform transfer of the black image forming layer. With the thickness being 0.5 μm or greater, the black image forming layer can be uniformly transferred when recorded with high energy thereby attaining a satisfactory image density necessary as a color proof for printing. Since the tendency to transfer unevenness becomes conspicuous under high humidity conditions, the thickness of 0.5 μm or greater is particularly effective to reduce environment-induced variations in density. On the other hand, the black image forming layer thickness of 0.7 μm or smaller is effective in maintaining the transfer sensitivity in laser recording and improving reproducibility of small dots and fine lines. These effects are more conspicuous under lower humidity conditions. Resolution can also be improved with the above layer thickness. The layer thickness of the black image forming layer of the black heat transfer sheet is still preferably 0.55 to 0.65 μm, particularly preferably 0.60 μm.

In addition to the black image forming layer thickness ranging 0.5 to 0.7 μm, it is preferred that the thickness of the other color image forming layers of the other heat transfer sheets (e.g., yellow, magenta, cyan, etc.) be from 0.2 to less than 0.5 μm. The 0.2 μm or greater thickness of these image forming layers (e.g., yellow, magenta, cyan, etc.) is effective to prevent transfer unevenness thereby to maintain the image density in laser recording. With the thickness of these color image forming layers being less than 0.5 μm, the transfer sensitivity and resolution are improved. A still preferred thickness of the image forming layers except a white image forming layer is from 0.3 to 0.45 μm.

It is preferred for the black image forming layer of the black heat transfer sheet to contain carbon black. The carbon black to be incorporated preferably comprises at least two kinds different in tinting strength from the viewpoint of ease of controlling reflection density while maintaining a P/B (pigment/binder) ratio within a specific range.

The tinting strength of carbon black can be represented in various terms. PVC blackness disclosed in JP-A-10-140033 is among them. PVC blackness of carbon black is determined as follows. Carbon black to be evaluated is dispersed in a polyvinyl chloride resin by a two-roll mill and molded into a sheet. The blacknesses of Carbon Black #40 and #45, both available from Mitsubishi Chemicals Co., Ltd. being taken as 1 point and 10 points, respectively, the PVC blackness of the sample sheet is rated by visual observation on a 10 point scale. Two or more carbon blacks having different PVC blacknesses can be used in an appropriate combination according to the purpose.

Preparation of Sample:

The following components are kneaded in a 250 cc Banbury mixer at 115° C. for 4 minutes to prepare a master batch having a carbon black content of 40% by weight.

Master Batch Formulation:

| | |
|---|---|
| Low-density linear polyethylene (LDPE) | 101.89 g |
| Calcium stearate | 1.39 g |
| Irganox 1010 | 0.87 g |
| Carbon black | 69.43 g |

The master batch is diluted according to the following formulation in a two-roll mill at 120° C. to prepare a compound having a carbon black content of 1% by weight.

Compound Formulation:

| | |
|---|---|
| LDPE | 58.3 g |
| Calcium stearate | 0.2 g |
| Carbon black master batch | 1.5 g |

The resulting compound is extruded through a slit width of 0.3 mm, and the extruded sheet is cut into chips. The chips are molded into a film having a thickness of 65±3 μm on a hot plate set at 240° C.

The method of forming a multicolor image according to the present invention includes the above-described method comprising successively transferring a plurality of images on the same image receiving sheet by using the heat transfer sheets of different colors to form a multicolor image on the image receiving sheet and a method comprising separately transferring images of the heat transfer sheets to as many image receiving sheets as the heat transfer sheets and re-transferring the transfer images onto printing paper, etc. to form a multicolor image on the paper.

More specifically, the latter method is carried out, for example, as follows. A laminate of an image receiving sheet and a heat transfer sheet is prepared for each of five or more colors (cyan,magenta, yellow, black, red, etc.). Each laminate is irradiated with laser light in accordance with the respective digital signals (e.g., through a color separation filter), and the heat transfer sheet is stripped off the image receiving sheet to obtain a color separated image for each color on the image receiving sheet. Thereafter, the color separated images are successively re-transferred to an actual support, such as printing paper or an equivalent, to form a multicolor image.

While the aforementioned laser thermal transfer recording technology is preferably applied to thin film thermal transfer recording, it is also applicable to other thermal transfer systems, such as melt transfer recording, ablation transfer recording, and sublimation transfer recording. Therefore, the system of the invention includes in its scope the image forming elements useful in these other thermal transfer recording systems.

The heat transfer sheets and the image receiving sheet according to the present invention will be described in detail.

The heat transfer sheets each comprises a substrate, a light-heat conversion layer, and an image forming layer and an optional layer(s).

The substrate of the heat transfer sheet can be of any material of choice. It is desirable for the substrate to have stiffness, dimensional stability, and heat resistance withstanding the heat of laser recording. Preferred substrate materials include synthetic resins, such as polyethylene terephthalate, polyethylene-2,6-naphthalate, polycarbonate, polymethyl methacrylate, polyethylene, polypropylene, polyvinyl chloride, polyvinylidene chloride, polystyrene, styrene-acrylonitrile copolymers, polyamide (aromatic or aliphatic), polyimide, polyamide-imide, and polysulfone. A biaxially stretched polyethylene terephthalate film is preferred of them from the standpoint of mechanical strength and dimensional stability against heat. In the preparation of color proofs by laser recording, the substrate of the heat transfer sheet is preferably made of transparent synthetic resins which transmit laser beams. The thickness of the substrate is preferably 25 to 130 μm, still preferably 50 to 120 μm. The substrate preferably has a center-line average surface roughness Ra of less than 0.1 μm on its image forming layer side. In the present invention Ra values are measured in accordance with JIS B0601 with, for example, a profilometer (e.g., Surfcom available from Tokyo Seiki Co., Ltd.). The substrate preferably has a Young's modulus of 200 to 1200 kg/mm2 (≈2 to 12 GPa) in the machine direction (MD) and of 250 to 1600 $kg/mm^2$ (≈2.5 to 16 GPa) in the transverse direction (TD). The F-5 value of the substrate in the MD is preferably 5 to 50 $kg/mm^2$ (≈49 to 490 MPa), and that in the TD is preferably 3 to 30 $kg/mm^2$ (≈29.4 to 294 MPa). The F-5 value in the MD is generally higher than that in the TD, but this is not the case when the substrate is required to be stronger in the TD than in the MD. The thermal shrinkage of the substrate when treated at 100° C. for 30 minutes is preferably 3% or less, still preferably 1.5% or less, in both TD and MD. The thermal shrinkage at 80° C. for 30 minutes is preferably 1% or less, still preferably 0.5% or less, in both MD and TD. The substrate preferably has a breaking strength of 5 to 100 kg/mm$^2$ (≈49 to 980 MPa) in both directions and an elastic modulus at 20° C. of 100 to 2,000 kg/mm$^2$ (≈0.98 to 19.6 GPa).

In order to improve adhesion between the substrate and the light-heat conversion layer, the substrate maybe subjected to a surface activation treatment and/or be provided with one or more undercoating layers. The surface activation treatment includes glow discharge treatment and corona discharge treatment. The material of the undercoating layer is preferably selected from those having high adhesion to both the substrate and the light-heat conversion layer, low heat conductivity, and high heat resistance. Such materials include polystyrene, a styrene-butadiene copolymer, and gelatin. The total thickness of the undercoating layers is generally 0.01 to 2 μm. If desired, the opposite side of the substrate may also be surface-treated or provided with a functional layer, such as an antireflection layer or an antistatic layer. It is particularly advisable to provide a backcoating layer containing an antistatic agent on the back of the substrate.

The backcoating layer preferably comprises a first backcoating layer contiguous to the substrate and a second backcoating layer provided on the first backcoating layer. It is preferred that the weight ratio of the antistatic agent B contained in the second backcoating layer to the antistatic agent A contained in the first backing layer, B/A, be less than 0.3. A B/A ratio of 0.3 or more tends to result in reduction of sliding properties and cause powder fall-off from the backcoating layer.

The thickness C of the first backcoating layer is preferably 0.01 to 1 μm, still preferably 0.01 to 0.2 μm. The thickness D of the second backcoating layer is preferably 0.01 to 1 μm, still preferably 0.01 to 0.2 μm. The thickness ratio C/D is preferably 1/2 to 5/1.

The antistatic agents which can be used in the first and second backcoating layers include nonionic surface active agents, e.g., polyoxyethylene alkylamines and glycerol fatty acid esters; cationic surface active agents, e.g., quaternary ammonium salts; anionic surface active agents, e.g., alkylphosphates; amphoteric surface active agents; and electrically conductive resins.

Fine electrically conductive particles can also be used as an antistatic agent. Examples of such fine electrically conductive particles include oxides, e.g., ZnO, $TiO_2$, $SnO_3$, $Al_2O_3$, $In_2O_3$, MgO, BaO, CoO, CuO, $Cu_2O$, CaO, SrO, $BaO_2$, PbO, $PbO_2$, $MnO_2$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$, and $MgB_2O_5$; sulfides, e.g., CuS and ZnS; carbides, e.g., SiC, TiC, ZrC, VC, NbC, MoC, and WC; nitrides, e.g., $Si_3N_4$, TiN, ZrN, VN, NbN, and $Cr_2N$; borides, e.g., $TiB_2$, $ZrB_2$, $NbB_2$, $TaB_2$, CrB, MoB, WB, and $LaB_5$; silicides, e.g., $TiSi_2$, $ZrSi_2$, $NbSi_2$, $TaSi_2$, $CrSi_2$, $MoSi_2$, and $WSi_2$; metal salts, e.g., $BaCO_3$, $CaCO_3$, $SrCO_3$, $BaSO_4$, and $CaSO_4$; and composites, e.g., $SiN_4$/SiC and $9Al_2O_3/2B_2O_3$. These electrically conductive substances may be used either alone or in a combination of two or more thereof. Preferred of them are $SnO_2$, ZnO, $Al_2O_3$, $TiO_2$, $In_2O_3$, MgO, BaO, and $MoO_3$. Still preferred are $SnO_2$, ZnO, $In_2O_3$, and $TiO_2$, with $SnO_2$ being particularly preferred.

In laser thermal transfer recording, the antistatic agents used in the backcoating layer are preferably substantially transparent so as to transmit laser beams.

In using an electrically conductive inorganic compound fine particles explained above as the antistatic agent, the particle size is preferably as small as possible to minimize light scattering, but the particle size should be determined based on the ratio of the refractive index of the particles to that of the binder as a parameter, which can be obtained according to Mie theory. The average particle size of the electrically conductive inorganic compound fine particles is generally 0.001 to 0.5 μm, preferably 0.003 to 0.2 μm. The term "average particle size" as used herein is intended to cover not only primary particles but agglomerates.

The first and second backcoating layers may further contain a binder and various other additives, such as surface active agents, slip agents, and matting agents. The amount of the antistatic agent in the first backcoating layer is preferably 10 to 1,000 parts by weight, still preferably 200 to 800 parts by weight, per 100 parts by weight of the binder. The amount of the antistatic agent in the second backcoating layer is preferably 0 to 300 parts by weight, still preferably 0 to 100 parts by weight, per 100 parts by weight of the binder.

The binders which can be used in the first and second backcoating layers include homopolymers and copolymers of acrylic monomers, e.g., acrylic acid, methacrylic acid, acrylic esters and methacrylic esters; cellulosic polymers, e.g., nitrocellulose, methyl cellulose, ethyl cellulose, and cellulose acetate; polymers of vinyl compounds, e.g., polyethylene, polypropylene, polystyrene, vinyl chloride copolymers, vinyl chloride-vinyl acetate copolymers, polyvinyl pyrrolidone, polyvinyl butyral, and polyvinyl alcohol; condensed polymers, e.g., polyester, polyurethane, and polyamide; elastic thermoplastic polymers, e.g., butadiene-styrene copolymers; polymers obtained by polymerization or crosslinking of photopolymerizable or heat polymerizable compounds, e.g., epoxy compounds; and melamine compounds.

The light-heat conversion layer comprises a light-heat converting substance and a binder. If necessary, it can contain a matting agent. It may further contain other additives, if desired.

The light-heat converting substance is a substance capable of converting light energy to heat energy when irradiated with light. This substance is generally a colorant (inclusive of a dye and a pigment) capable of absorbing laser light. In infrared laser recording, infrared absorbing colorants are preferably used. Useful infrared absorbing colorants include black pigments, e.g., carbon black; macrocyclic compound pigments showing absorption in the visible to near-infrared region, such as phthalocyanine pigments and naphthalocyanine pigments; organic dyes used in high-density laser recording media (e.g., optical disks), such as cyanine dyes (e.g., indolenine dyes), anthraquinone dyes, azulene dyes, and phthalocyanine dyes; and organometallic colorants, such as dithiol nickel complexes. Inter alia, cyanine dyes have a high absorptivity coefficient in the infrared region. Use of the cyanine dyes as a light-heat converting substance makes it feasible to reduce the thickness of the light-heat conversion layer, which leads to improved recording sensitivity of the heat transfer sheet. Particularly preferred light-heat converting substances will be described later.

Useful light-heat converting substances include not only the colorants but inorganic materials such as particulate metallic materials, e.g., blackened silver.

The binder which can be used in the light-heat conversion layer is preferably a resin having strength enough to form a layer on the substrate and a high heat conductivity, still preferably a resin having such heat resistance so as not to decompose by the heat generated by the light-heat converting substance. A heat-resistant resin maintains the surface smoothness of the light-heat conversion layer after irradiation with high energy light. Specifically, the binder resin preferably has a heat decomposition temperature of 400° C. or higher, particularly 500° C. or higher, as measured by TGA (thermogravimetric analysis). The heat decomposition temperature as used herein means the temperature at which a sample reduces its weight by 5% when heated in an air stream at a temperature rise rate of 10° C./min. The binder resin preferably has a glass transition temperature (Tg) of 200 to 400° C., particularly 250 to 350° C. Resins having a Tg lower than 200° C. tend to cause fogging. Resins having a Tg higher than 400° C. have reduced solubility in a solvent, which can result in reduction of productivity.

It is preferred for the binder of the light-heat conversion layer to have higher heat resistance (e.g., heat deformation temperature and heat decomposition temperature) than the materials used in other layers provided on the light-heat conversion layer.

The above-described preferred binder resins include acrylic resins, e.g., polymethyl methacrylate; polycarbonate; vinyl resins, e.g., polystyrene, vinyl chloride-vinyl acetate copolymers, and polyvinyl alcohol; polyvinyl butyral, polyester, polyvinyl chloride, polyamide, polyimide, polyether imide, polysulfone, polyether sulfone, aramid, polyurethane, epoxy resins, and urea-melamine resins. Polyimide resins are especially preferred of them.

In particular, polyimide resins represented by formulae (I) to (VII) shown below, being soluble in organic solvents, are preferably used to improve the productivity of the heat transfer sheets. These polyimide resins are also preferred for obtaining improvements on viscosity stability, long-term preservability and moisture resistance of a coating composition for heat-light conversion layer.

(I)

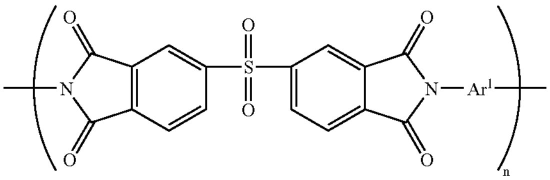

-continued (II)

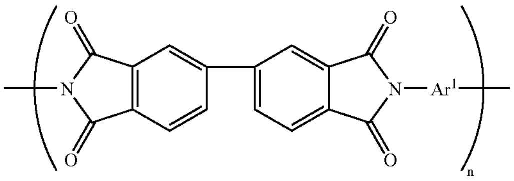

In formulae (I) and (II), $Ar^1$ represents an aromatic group represented by structural formulae (1) to (3); and n represents an integer of 10 to 100.

(1)

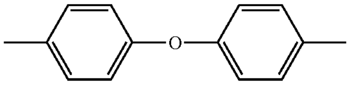

(2)

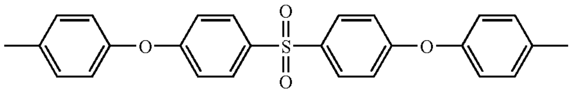

(3)

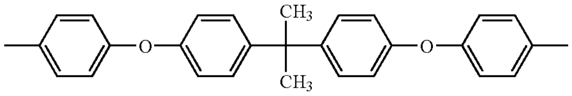

(III)

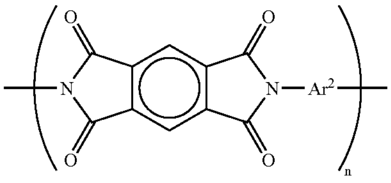

(IV)

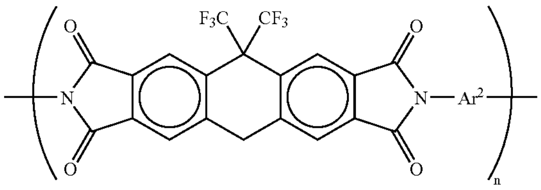

In formulae (III) and (IV), $Ar^2$ represents an aromatic group represented by structural formulae (4) to (7); and n represents an integer of 10 to 100.

(4)

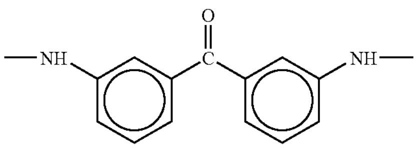

(5)

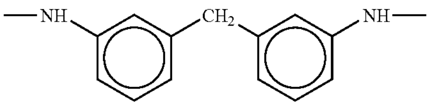

-continued (6)

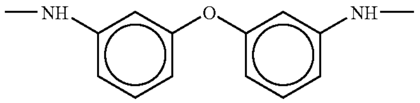

(7)

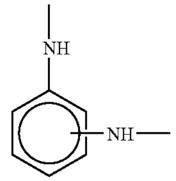

(V)

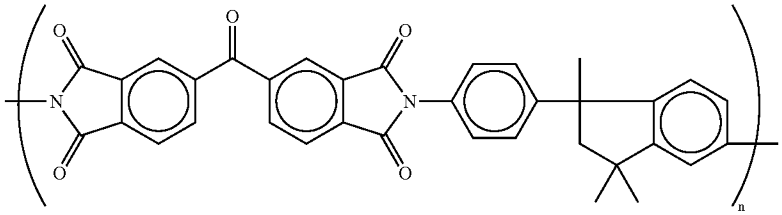

(VI)

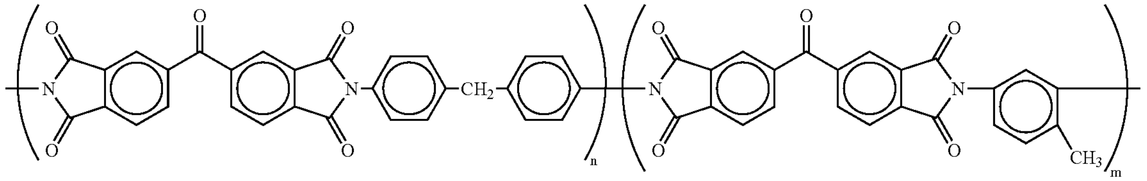

(VII)

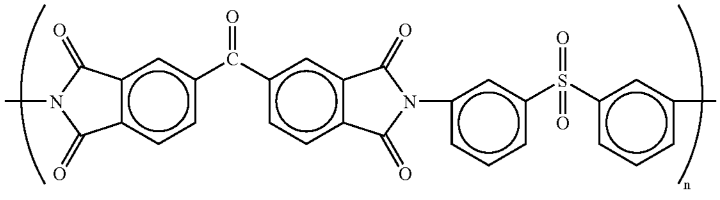

In formulae (V) to (VII), n and m each represent an integer of 10 to 100. In formula (VI), the ratio n/m is 6/4 to 9/1.

When at least 10 parts by weight of a binder resin dissolves in 100 parts by weight of N-methylpyrrolidone at 25° C., the resin can be seen as soluble in organic solvents. Resins having a solubility of 10 parts by weight or more in 100 parts by weight of N-methylpyrrolidone are preferably used as a binder of the light-heat conversion layer. Resins having a solubility of 100 parts by weight or more in 100 parts by weight of N-methylpyrrolidone are particularly preferred.

The matting agents which can be added to the light-heat conversion layer include fine inorganic or organic particles. The fine inorganic particles include metal oxides, e.g., silica, titanium oxide, aluminum oxide, zinc oxide, and magnesium oxide, metal salts, e. g., barium sulfate, magnesium sulfate, aluminum hydroxide, magnesium hydroxide, and boron nitride, kaolin, clay, talc, zinc flower, lead white, zeeklite, quartz, diatomaceous earth, pearlite, bentonite, mica, and synthetic mica. The fine organic particles include particles of fluorine resins, guanamine resins, acrylic resins, styrene-acryl copolymer resins, silicone resins, melamine resins, and epoxy resins.

The matting agent usually has a particle size of 0.3 to 30 μm, preferably 0.5 to 20 μm. It is preferably added in an amount of 0.1 to 100 $mg/m^2$.

If desired, the light-heat conversion layer can contain surface active agents, thickeners, antistatic agents, and the like.

The light-heat conversion layer is formed by applying a coating composition to a substrate and drying the coating. The coating composition is prepared by dissolving the light-heat converting substance and a binder in an organic solvent and adding thereto a matting agent and other necessary additives. Organic solvents which can be used to dissolve the binder include n-hexane, cyclohexane, diglyme, xylene, toluene, ethyl acetate, tetrahydrofuran, methyl ethyl ketone, acetone, cyclohexanone, 1,4-dioxane, 1,3-dioxane, dimethyl acetate, N-methyl-2-pyrrolidone, dimethyl sulfoxide, dimethylformamide, dimethylacetamide, γ-butyrolactone, ethanol, and methanol. Application and drying of the coating composition can be carried out in a conventional manner. Drying is usually effected at temperatures of 300° C. or lower, preferably 200° C. or lower. Where a polyethylene terephthalate substrate is used, drying is preferably performed at 80 to 150° C.

Where the amount of the binder in the light-heat conversion layer is too small, the light-heat conversion layer has reduced cohesion and tends to accompany the image forming layer being transferred to the image receiving sheet, which causes image color mixing. Use of too much the binder necessitates an increase in layer thickness for achieving a given absorbance, which can invite sensitivity reduction. A preferred solid basis weight ratio of the light-heat converting substance to the binder in the light-heat conversion layer is 1:20 to 2:1, particularly 1:10 to 2:1.

As the light-heat conversion layer is made thinner, the sensitivity increases as stated previously. The thickness of the light-heat conversion layer is preferably 0.03 to 1.0 μm, still preferably 0.05 to 0.5 μm. From the standpoint of transfer sensitivity, the optical density of the light-heat conversion layer is preferably 0.80 to 1.26, still preferably 0.92 to 1.15, at a wavelength of 808 nm. If the optical density at a laser peak wavelength is less than 0.80, light to heat conversion tends to be insufficient, resulting in reduced transfer sensitivity. An optical density exceeding 1.26 will adversely affect the recording function of the light-heat conversion layer, which can result in fogging.

The image forming layer of each heat transfer sheet comprises a pigment which is transferred to the image receiving sheet to form an image, a binder for forming the layer, and, if desired, other components.

The pigment that can be used in the image forming layer are roughly divided into organic ones and inorganic ones. Organic pigments are particularly excellent in film transparency, and inorganic ones are generally excellent in hiding powder. Proper pigments are selected according to the purpose with these characteristics taken into consideration. In making heat transfer sheets for color proofing, it is preferred to use organic pigments whose color tones match or approximate the colors of printing inks, such as yellow (Y), magenta (M), cyan (C), black (K), green (G), orange (O), red (R), blue (B), white (W), gold (Go), silver (S), and pink (P). Metallic powders, fluorescent pigments, and the like are also used in some cases. Suitable organic pigments include azo pigments, phthalocyanine pigments, anthraquinone pigments, dioxazine pigments, quinacridone pigments, isoindolinone pigments, and nitro pigments. The pigments useful in the image-forming layer are listed below for illustrative purposes only but not for limitation.

1) Yellow Pigment

Pigment Yellow 12 (C.I. No. 21090):
- Example: Permanent Yellow DHG (from Clariant (Japan) KK), Lionol Yellow 1212B (from Toyo Ink Mfg. Co., Ltd.), Irgalite Yellow LCT (from Ciba Specialty Chemicals), Symuler Fast Yellow GTF219 (from Dainippon Ink & Chemicals, Inc.)

Pigment Yellow 13 (C.I. No. 21100):
- Example: Permanent Yellow GR (from Clariant (Japan) KK), Lionol Yellow 1313 (from Toyo Ink Mfg. Co., Ltd.)

Pigment Yellow 14 (C.I. No. 21095):
- Example: Permanent Yellow G (from Clariant (Japan) KK), Lionol Yellow1401-G (from Toyo Ink Mfg. Co. , Ltd.), Seika Fast Yellow 2270 (from Dainichiseika Colour & Chemicals Mgf. Co., Ltd.), Symuler Fast Yellow 4400 (from Dainippon Ink & Chemicals, Inc.)

Pigment Yellow 17 (C.I. No. 21105):
- Example: Permanent Yellow GG02 (from Clariant (Japan) KK), Symuler Fast Yellow 8GF (from Dainippon Ink & Chemicals, Inc.)

Pigment Yellow 155:
- Example: Graphtol Yellow 3GP (from Clariant (Japan) KK)

Pigment Yellow 180 (C.I. No. 21290):
- Example: Novoperm Yellow P-HG (from Clariant (Japan) KK.), PV Fast Yellow HG (from Clariant (Japan) KK.)

Pigment Yellow 139 (C.I. No. 56298):
- Example: Novoperm Yellow M2R 70 (from Clariant (Japan) KK.)

2) Magenta Pigment

Pigment Red 57:1 (C.I. No. 15850:1):
- Example: Graphtol Rubine L6B (from Clariant (Japan) KK), Lionol Red 6B-4290G (from Toyo Ink Mfg. Co., Ltd.), Irgalite Rubine 4BL (from Ciba Specialty Chemicals), Symuler Brilliant Carmine 6B-229 (from Dainippon Ink & Chemicals, Inc.)

Pigment Red 122 (C.I. No. 73915):
- Example: Hosterperm Pink E (from Clariant (Japan) KK.), Lionogen Magenta 5790 (from Toyo Ink Mfg. Co., Ltd.), Fastogen Super Magenta RH (from Dainippon Ink & Chemicals, Inc.)

Pigment Red 53:1 (C.I. No. 15585:1):
- Example: Permanent Lake Red LCY (from Clariant (Japan) KK), Symuler Lake Red C conc (from Dainippon Ink & Chemicals, Inc.)

Pigment Red 48:2 (C.I. No. 15865:2):
- Example: Permanent Red W2T (from Clariant (Japan) KK), Lionol Red LX235 (from Toyo Ink Mfg. Co., Ltd.), Symuler Red 3012 (from Dainippon Ink & Chemicals, Inc.)

Pigment Red 177 (C.I. No. 65300):
- Example: Cromophtal Red A2B (from Ciba Specialty Chemicals)

3) Cyan Pigment

Pigment Blue 15 (C.I. No. 74160):
- Example: Lionol Blue 7027 (from Toyo Ink Mfg. Co., Ltd.), Fastogen Blue BB (from Dainippon Ink & Chemicals, Inc.)

Pigment Blue 15:1 (C.I. No. 74160):
- Example: Hosterperm Blue A2R (from Clariant (Japan) KK), Fastogen Blue 5050 (from Dainippon Ink & Chemicals, Inc.)

Pigment Blue 15:2 (C.I. No. 74160):
- Example: Hosterperm Blue AFL (from Clariant (Japan) KK), Irgalite Blue BSP (from Ciba Specialty Chemicals), Fastogen Blue GP (from Dainippon Ink & Chemicals, Inc.)

Pigment Blue 15:3 (C.I. No. 74160):
- Example: Hosterperm Blue B2G (from Clariant (Japan) KK.), Lionol Blue FG7330 (from Toyo Ink Mfg. Co., Ltd.), Cromophtal Blue 4GNP (from Ciba Specialty Chemicals), Fastogen Blue FGF (from Dainippon Ink & Chemicals, Inc.)

Pigment Blue 15:4 (C.I. No. 74160):
- Example: Hosterperm Blue BFL (from Clariant (Japan) KK), Cyanine Blue 700-10FG (from Toyo Ink Mfg. Co., Ltd.), Irgalite Blue GLNF (from Ciba Specialty Chemicals), Fastogen Blue FGS (from Dainippon Ink & Chemicals, Inc.)

4) Black Pigment

Pigment Black 7 (carbon black C.I. No. 77266):
- Example: Mitsubishi Carbon Black MA100 (from Mitsubishi Chemicals Co., Ltd.), Mitsubishi Carbon Black #5 (from Mitsubishi Chemicals Co., Ltd.), Black Pearls 430 (from Cabot Co.)

5) Red Pigment

Pigment Red 48:1 (C.I. No. 15865:1):
- Examples: Lionol Red 2B-FG3300 (from Toyo Ink Mfg. Co., Ltd.), Symuler Red NRY 3108 (from Dainippon Ink & Chemicals, Inc.)

Pigment Red 48:3 (C.I. No. 15865:3):
- Examples: Permanent Red 3RL (from Clariant (Japan) KK), Symuler Red 2BS (from Dainippon Ink & Chemicals, Inc.)

6) Blue Pigment

Pigment Blue 15:6 (C.I. No. 74160):
- Lionol Blue ES (from Toyo Ink Mfg. Co., Ltd.)

Pigment Blue 60 (C.I. No. 69800):

Example: Hosterperm Blue RL01 (from Clariant (Japan) KK), Lionogen Blue 6501 (from Toyo Ink Mfg. Co., Ltd.)

7) Green Pigment

Pigment Green 7 (C.I. No. 74260):

Example: Fastogen Green S (from Dainippon Ink & Chemicals, Inc.)

Pigment Green 36 (C.I. No. 74265):

Example: Fastogen Green MY (from Dainippon Ink & Chemicals, Inc.)

8) Orange Pigment

Pigment Orange 43 (C.I. No. 71105):

Example: Hosterperm Orange GR (from Clariant (Japan) KK)

9) White Pigment

Example: titanium oxide, aluminum oxide

10) Gold Pigment

Aluminum powder, mica

11) Silver Pigment

Aluminum powder, mica

The pigments to be used in the invention can be chosen from commercially available products by referring to Nippon Ganryo Gijutsu Kyokai (ed.), Ganryo Binran, Seibundo Shinko-Sha (1989), and *COLOUR INDEX, THE SOCIETY OF DYES & COLOURIST*, 3rd Ed. (1987).

The above-described pigments preferably have an average particle size of 0.03 to 1 μm, particularly 0.05 to 0.5 μm. Where the average particle size is smaller than 0.03 μm, pigment dispersing cost tends to increase, and dispersions tend to gel. As far as the average particle size is 1 μm or smaller, there is no coarse particles, which assures good adhesion between the image forming layer and the image receiving layer and improves the transparency of the image forming layer.

The binder to be used in the image forming layer preferably includes amorphous organic polymers having a softening point of 40 to 150° C. Such polymers include butyral resins, polyamide resins, polyethylene-imine resins, sulfonamide resins, polyester polyol resins, petroleum resins; homo- and copolymers of styrene or derivatives thereof, e.g., styrene, vinyltoluene, α-methylstyrene, 2-methylstyrene, chlorostyrene, vinylbenzoic acid, sodium vinylbenzenesulfonate, and aminostyrene; and homo- and copolymers of vinyl compounds, such as methacrylic acid and esters thereof, e.g., methyl methacrylate, ethyl methacrylate, butyl methacrylate, and hydroxyethyl methacrylate, acrylic acid and esters thereof, e.g., methyl acrylate, ethyl acrylate, butyl acrylate, and α-ethylhexyl acrylate, dienes, e.g., butadiene and isoprene, acrylonitrile, vinyl ethers, maleic acid, maleic esters, maleic anhydride, cinnamic acid, vinyl chloride, and vinyl acetate. These resins may be used either individually or as a mixture thereof.

The image forming layer preferably contains 30 to 70% by weight, particularly 30 to 50% by weight, of the pigment and 30 to 70% by weight, particularly 40 to 70% by weight, of the binder resin.

The image forming layer can further contain the following components.

1) Waxes

Useful waxes include mineral waxes, natural waxes and synthetic waxes. Examples of the mineral waxes are petroleum waxes, such as paraffin wax, microcrystalline wax, and ester wax, oxide waxes, montan wax, ozokerite and ceresin. Paraffin wax is preferred above all. The paraffin wax is separated from petroleum, and various products having different melting points are commercially available. The natural waxes include vegetable waxes, e.g., carnauba wax, Japan wax, auriculae wax, and esparto wax, and animal waxes, e.g., beeswax, insect wax, shellac wax, and spermaceti.

The synthetic waxes are commonly used as a lubricant and generally comprise higher fatty acid compounds. Included are:

(a) Fatty Acid Waxes

Straight-chain saturated fatty acids represented by formula:

$$CH_3(CH_2)_nCOOH$$

wherein n is an integer of 6 to 28, such as stearic acid, behenic acid, palmitic acid, 12-hydroxy stearic acid, and azelaic acid; and their metal (e.g., K, Ca, Zn or Mg) salts.

(b) Fatty Acid Ester Waxes

Fatty acid esters, such as ethyl stearate, lauryl stearate, ethyl behenate, hexyl behenate, and behenyl myristate.

(c) Fatty Acid Amide Waxes

Fatty acid amides, such as stearamide and lauramide.

(d) Aliphatic Alcohol Waxes

Straight-chain saturated aliphatic alcohols represented by formula:

$$CH_3(CH_2)_nOH$$

wherein n is an integer of 6 to 28, such as stearyl alcohol.

Of the synthetic waxes (a) to (d), higher fatty acid amides such as stearamide and lauramide are suitable. These wax compounds can be used either alone or in a combination thereof.

2) Plasticizers

Suitable plasticizers include known ester compounds. Examples include vinyl compound esters such as acrylic esters and methacrylic esters; phthalic acid esters, e.g., dibutyl phthalate, di-n-octyl phthalate, di (2-ethylhexyl) phthalate, dinonyl phthalate, dilauryl phthalate, butyllauryl phthalate, and butylbenzyl phthalate; aliphatic dibasic acid esters, e.g., di(2-ethylhexyl) adipate, and di(2-ethylhexyl) sebacate; phosphoric triesters, e.g., tricresyl phosphate and tri(2-ethylhexyl) phosphate; polyol polyesters, e.g., polyethylene glycol esters; and epoxy compounds, e.g., epoxy fatty acid esters. Among them, vinyl compound esters, particularly acrylic esters and methacrylic esters are preferred in view of their effects in improving transfer sensitivity, preventing transfer unevenness, and controlling elongation at break. Examples of acrylic and methacrylic esters are polyethylene glycol dimethacrylate, 1,2,4-butanetriol trimethacrylate, trimethylolethane triacrylate, pentaerythritol acrylate, pentaerythritol tetraacrylate, and dipentaerythritol polyacrylate.

Polymeric plasticizers are also useful. Polyesters are preferred polymeric plasticizers because of their high effect of addition and non-diffusibility during storage. Polyester plasticizers include sebacic acid polyesters and adipic acid polyesters.

The plasticizers which can be added to the image forming layer are not limited to those described. The plasticizers recited above can be used either individually or as a combination of two or more thereof.

Too much additives added to the image forming layer, there would result impaired resolution of a transferred image, reduced strength of the image forming layer, or reduced adhesion between the image forming layer and the light-heat conversion layer. Poor adhesion can result in undesired transfer of a non-exposed area of the image forming layer to an image receiving sheet. From this viewpoint, a recommended wax content in the image forming layer is 0.1 to 30% by weight, preferably 1 to 20% by weight, based on the total solids content of the image forming layer. Likewise, a recommended plasticizer content is 0.1 to 20% by weight, preferably 0.1 to 10% by weight, based on the total solids content of the image forming layer.

(3) Other Additives

The image forming layer may further contain other additives, such as surface active agents, organic or inorganic fine particles (metallic powder or silica gel), oils (e.g., linseed oil and mineral oil), thickeners, and antistatic agents. A substance having an absorption at a writing laser wav length can be added to the image forming layer except for the case where a black image is to be formed, which is beneficial. for transfer energy saving. While such a substance may be either a pigment or a dye, it is desirable for color reproduction to use a recording light source emitting infrared light (e.g., semiconductor laser) and to add a dye having a small absorption in the visible region and a large absorption at the wavelength of the light source. Useful near infrared absorbing dyes are described in JP-A-3-103476.

The image forming layer can be formed by dissolving or dispersing the pigment and the binder in a solvent to prepare a coating composition, applying the coating composition on the light-heat conversion layer (or a heat-sensitive release layer if provided on the light-heat conversion layer as described later), and drying the coating. The solvent for use in the preparation of the coating composition includes n-propyl alcohol, methyl ethyl ketone, propylene glycol monomethyl ether, methanol and water. Coating and drying can be performed according to ordinary coating and drying methods.

The heat transfer sheets may each have a heat-sensitive release layer between the light-heat conversion layer and the image forming layer. The heat-sensitive release layer contains a heat-sensitive material which generates gas or releases adsorption water by the action of the heat generated in the light-heat conversion layer and thereby reduces the adhesive strength between the light-heat conversion layer and the image forming layer. Such a heat-sensitive material includes those compounds, inclusive of polymers and low-molecular compounds, which decompose or denature by heat to generate gas and those compounds, inclusive of polymers and low-molecular compounds, which have absorbed or adsorbed a considerable amount of a volatile compound, such as water. These types of compounds may be used in combination.

Polymers which generate gas on thermal decomposition or denaturation include self-oxidizing polymers, e.g., nitrocellulose; halogen-containing polymers, e.g., chlorinated polyolefin, chlorinated rubber, polychlorinated rubber, polyvinyl chloride, and polyvinylidene chloride; acrylic polymers (e.g., polyisobutyl methacrylate) having adsorbed a volatile compound such as water; cellulose esters (e.g., ethyl cellulose) having adsorbed a volatile compound such as water; and natural high molecular compounds (e.g., gelatin) having adsorbed a volatile compound such as water. Low-molecular compounds which generate gas on heat decomposition or denaturation include diazo compounds and azide compounds which thermally decompose to generate gas.

It is desirable that decomposition or denaturation of the heat-sensitive material should occur at 280° C. or lower, particularly 230° C. or lower.

When a low-molecular heat-sensitive material is used in the heat-sensitive release layer, it is preferably used in combination with a binder. The binder to be used may be either of the type that decomposes or denatures to generate gas or of the type that does not. The weight ratio of the low-molecular heat-sensitive compound to the binder if used is preferably 0.02/1 to 3/1, still preferably 0.05/1 to 2/1. It is preferred that the heat-sensitive release layer be provided on substantially the entire surface of the light-heat conversion layer. The thickness of the heat-sensitive release layer is usually 0.03 to 1 μm, preferably 0.05 to 0.5 μm.

According to the layer structure having a light-heat conversion layer, a heat-sensitive release layer, and an image forming layer on the substrate in that order, the heat-sensitive release layer decomposes or denatures by heat conducted from the light-heat conversion layer to generate gas. As a result of this decomposition or gas generation, part of the heat-sensitive release layer disappears, or cohesive failure occurs in the heat-sensitive release layer. It follows that the adhesive strength between the light-heat conversion layer and the image forming layer is reduced. Here, depending on the behavior of the heat-sensitive release layer, cases are sometimes met with in which part of the heat-sensitive release layer accompanies the image forming layer transferred to the image receiving sheet, which can cause color mixing in the transfer image. Therefore, it is desirable that the heat-sensitive release layer is substantially colorless so that no perceptible color mixing may occur even if such undesired transfer of the heat-sensitive release layer should happen. In other words, the heat-sensitive release layer should desirably have high transparency to visible rays. Specifically, the absorbance of the heat-sensitive release layer in the visible region is 50% or less, preferably 10% or less.

Instead of providing an independent heat-sensitive release layer, the above-mentioned light-sensitive material may be incorporated into the light-heat conversion layer so that the light-heat conversion layer may perform the function as a light-heat conversion layer combined with the function as a heat-sensitive release layer.

It is preferred for the heat transfer sheet to have a coefficient of static friction of 0.35 or smaller, particularly 0.20 or smaller, on its surface of the image forming layer side. With this design, the feed rollers for carrying the heat transfer sheets are prevented from being contaminated, and the quality of the transfer image can be improved. The coefficient of static friction is measured in accordance with the method taught in Japanese Patent Application No. 2000-85759, para. [0011].

The image forming layer preferably has a smooster value of 0.5 to 50 mmHg (≈0.0665 to 6.65 kPa) at 23° C. and 55% RH and a center-line average surface roughness Ra of 0.05 to 0.4 μm. The Ra is measured with a profilometer, e.g., Surfcom (available from Tokyo Seimitsu Co., Ltd.) in accordance with JIS B0601. With these surface roughness parameters falling within the recited ranges, the microscopic spaces formed between the image receiving layer and the image forming layer are reduced in size and number, which favors to image transfer and image quality. The surface hardness of the image forming layer is preferably 10 g or more measured with a sapphire stylus. The static dissipation capability of the image forming layer is preferably such that, when the layer is electrically charged according to Federal Test Standard Method 4046 and then grounded, the electrification potential 1 second after grounding is −100 to 100 V. It is preferred that the surface resistivity of the image forming layer at 23° C. and 55% RH be $10^9$ Ω or less.

The image receiving sheet which can be used in combination with the above-described heat transfer sheets generally comprises a substrate and an image receiving layer. The image receiving sheet may additionally have one or more layers selected from a cushioning layer, a release layer, and an intermediate layer provided between the substrate and the image receiving layer. To secure smooth pass of the image receiving sheet in the recording apparatus, it is preferred to provide a backcoating layer on the back side of the substrate.

The substrate of the image receiving sheet includes a resin sheet, a metal sheet, a glass sheet, resin-coated paper, paper, and various composite laminates. Resins which can be used as a substrate include polyethylene terephthalate, polycarbonate, polyethylene, polyvinyl chloride, polyvinylidene chloride, polystyrene, styrene-acrylonitrile copolymers, and polyester. Paper as a substrate includes actual printing paper and coated paper.

It is preferred for the substrate to have micro voids to improve quality of a transfer image. Substrates with micro voids can be obtained by, for example, extruding one or more molten mixtures of a thermoplastic resin and a filler, such as an inorganic pigment or a polymer incompatible with the thermoplastic resin matrix, into a single-layer or multilayer film and stretching the extruded film uniaxially or biaxially. The void of the resulting stretched film depends on the kinds of the resin and the filler, the mixing ratio, and the stretching conditions.

As a thermoplastic resin matrix, a polyolefin resin, such as polypropylene, or polyethylene terephthalate is preferably used in view of their good crystallinity and stretchability necessary to form voids. A combination of a polyolefin resin or polyethylene terephthalate and a minor proportion of other thermoplastic resin is preferred. The pigment used as a filler preferably has an average particle size of from 1 to 20 μm. Useful pigments are calcium carbonate, clay, diatomaceous earth, titanium oxide, aluminum hydroxide, and silica. In using polypropylene as a thermoplastic resin matrix, polyethylene terephthalate is a preferred filler incompatible with the matrix. For the details of preparation of a substrate with micro voids, reference can be made in JP-A-2001-105752. The content of the filler, such as an inorganic pigment, in the substrate is usually about 2 to 30% by volume.

The thickness of the substrate of the image receiving sheet is usually from 10 to 400 μm, preferably 25 to 200 μm. The substrate may be subjected to surface treatment, e.g. , corona discharge treatment or glow discharge treatment to have improved adhesion to the image receiving layer (or a cushioning layer if provided as described infra) or to improve the adhesion between the image receiving layer and the image forming layer of the heat transfer sheet.

The image receiving sheet has at least one image receiving layer for receiving and holding the image forming layer being transferred from the heat transfer sheet. The image receiving layer is preferably formed of a resin binder matrix. The resin binder is preferably a thermoplastic resin. Examples of suitable thermoplastic resin binders include homopolymers and copolymers of acrylic monomers, e.g., acrylic acid, methacrylic acid, acrylic esters, and methacrylic esters; cellulosic resins, e. g., methyl cellulose, ethyl cellulose, and cellulose acetate; homopolymers and copolymers of vinyl monomers, e.g., polystyrene, polyvinylpyrrolidone, polyvinyl butyral, polyvinyl alcohol, and polyvinyl chloride; condensed polymers, e.g., polyester and polyamide; and rubbery polymers, e.g., butadiene-styrene copolymers. The binder of the image receiving layer preferably has a Tg of 90° C. or lower so as to exhibit moderate adhesion to the image forming layer. A plasticizer may be added to the image forming layer for the purpose of lowering the Tg. The binder resin preferably has a Tg of 30° C. or higher for preventing film blocking. It is particularly preferred that the binder resin of the image receiving layer of the image receiving sheet and that of the image forming layer of the heat transfer sheet be the same or at least analogous to each other so that these layers may be in intimate contact during laser writing thereby to improve transfer sensitivity and image strength.

The image receiving layer surface preferably has a smooster value of 0.5 to 50 mmHg (≈0.0665 to 6.65 kPa) measured at 23° C. and 55% RH and an Ra of 0.05 to 0.4 μm. The Ra is measured with a profilometer (Surfcom available from Tokyo Seimitsu Co., Ltd.) in accordance with JIS B0601. The surface roughness parameters of the image receiving layer falling within these ranges, the microscopic spaces formed between the image receiving layer and the image forming layer are reduced in size and number, which favors to image transfer and image quality. The static dissipation capability of the image receiving layer is preferably −100 to 100 V as measured in the same manner as described above. It is preferred that the surface resistivity of the image receiving layer at 23° C. and 55% RH be $10^9$ Ω or less. The image receiving layer preferably has a coefficient of static friction of 0.2 or smaller and a surface energy of 23 to 35 mg/$m^2$.

Where the transfer image on the image receiving layer is re-transferred to printing paper, etc., it is preferred that at least one image receiving layer be made of a photocuring material. A photocuring material includes a combination comprising (a) at least one photopolymerizable monomer selected from polyfunctional vinyl and/or vinylidene compounds capable of addition polymerization, (b) an organic polymer, and (c) a photopolymerization initiator, and optionally (d) additives such as a thermal polymerization inhibitor. The polyfunctional vinyl monomers (a) include unsaturated esters of polyols, particularly acrylic or methacrylic esters (e.g., ethylene glycol diacrylate and pentaerythritol tetraacrylate).

The organic polymer (b) includes those recited above for use to form the image receiving layer. The photo polymerization initiator (c) includes ordinary photo-radical polymerization initiators, e.g., benzophenone and Michler's ketone. The initiator is usually used in an amount of 0.1 to 20% by weight based on the weight of the layer.

The thickness of the image receiving layer is generally from 0.3 to 7 μm, preferably from 0.7 to 4 μm. A thickness of 0.3 μm or larger secures sufficient film strength in re-transferring to printing paper. With a thickness of 4 μm or smaller, glossiness of the image after re-transfer to printing paper is suppressed to improve approximation to final prints.

A cushioning layer that is easily deformable with external stresses imposed on the image receiving layer may be provided between the substrate and the image receiving layer. A cushioning layer will improve adhesion between the image receiving layer and the image forming layer during laser writing, which leads to image quality improvement. Even when dust enters between the heat transfer sheet and the image receiving sheet, the cushioning layer will be deformed in conformity with the contour of the dust to minimize the non-contact area of the two sheets. As a result, possible image defects, such as white spots, can be minimized in size. Furthermore, when the transfer image on the image receiving sheet is re-transferred to printing paper, etc., the image receiving layer is deformable in conformity with the surface roughness of the paper thereby to improve the transfer capabilities. The cushioning layer is also effective in controlling the glossiness of the re-transfer image and improving approximation to the final prints.

The cushioning layer producing these effects is preferably formed of materials having a low elastic modulus, materials having rubbery elasticity or thermoplastic resins ready to soften on heating. The cushioning layer preferably has an elastic modulus of 0.5 MPa to 1.0 GPa, particularly 1 MPa to 0.5 GPa, especially 10 to 100 MPa, at room temperature. In order for the cushioning layer to have dust or debris sinking, the cushioning layer preferably has a penetration of 10 or more as measured according to JIS K2530 (25° C., 100 g, 5 seconds). The cushioning layer preferably has a Tg of 80° C. or lower, particularly 25° C. or lower, and a softening point of 50 to 200° C. To control these physical properties, such as the Tg, a plasticizer may be added to the polymer binder forming the cushioning layer.

Binders making up the cushioning layer include rubbers, such as urethane rubber, butadiene rubber, nitrile rubber, acrylic rubber, and natural rubber, polyethylene, polypropylene, polyester, styrene-butadiene copolymers, ethylene-vinyl acetate copolymer, ethylene-acrylic copolymers, vinyl chloride-vinyl acetate copolymers, vinylidene chloride resins, vinyl chloride resins containing a plasticizer, polyamide resins, and phenol resins. The thickness of the cushioning layer is usually 3 to 100 μm, preferably 10 to 52 μm, while varying depending on the kind of the binder and other conditions.

Although the image receiving layer and the cushioning layer must adhere to each other until completion of laser writing, the image receiving layer is preferably releasable when re-transferring the transfer image onto printing paper. To facilitate the release from the cushioning layer, a release layer having a thickness of about 0.1 to 2 μm can be provided between the cushioning layer and the image receiving layer. The thickness of the release layer, which can be adjusted by proper choice of material, should be small so as not to impair the effects of the cushioning layer.

Binders used to form the release layer include thermoplastic resins having a Tg of 65° C. or higher, such as polyolefins, polyester, polyvinyl acetal, polyvinyl formal, polyparabanic acid, polymethyl methacrylate, polycarbonate, ethyl cellulose, nitrocellulose, methyl cellulose, carboxymethyl cellulose, hydroxypropyl cellulose, polyvinyl alcohol, polyvinyl chloride, urethane resins, fluorine resins, polystyrene, acrylonitrile-styrene copolymers, crosslinking products of these resins, polyamide, polyimide, polyetherimide, polysulfone, polyether sulfone, and aramid; and hardened products thereof. Commonly employed hardening agents, such as isocyanate and melamine, can be used for hardening.

The physical properties described above taken into consideration, binders preferred for making the release layer are polycarbonate, acetal resins, and ethyl cellulose for their good storage stability. These binders are particularly suitable for releasing the image receiving layer comprising an acrylic resin binder.

A layer that extremely reduces in adhesion to the image receiving layer on cooling can serve as a release layer. Such a layer comprises hot-melt compounds, such as waxes, and thermoplastic resins (binders) as a main ingredient. Useful hot-melt compounds are described in JP-A-63-193886. Preferred hot-melt compounds include microcrystalline wax, paraffin wax, and carnauba wax. Useful thermoplastic resins include ethylene copolymers, such as ethylene-vinyl acetate copolymers, and cellulosic resins.

If desired, the above-described release layer can contain such additives as higher fatty acids, higher alcohols, higher fatty acid esters, higher fatty acid amides, and higher aliphatic amines.

A layer that melts or softens on heating and undergoes cohesive failure also serves as a release layer. A supercooling material is preferably incorporated into a release layer of this kind. Useful supercooling materials include poly-ϵ-caprolactone, polyoxyethylene, benzotriazole, tribenzylamine, and vanillin.

A layer containing a compound which reduces the adhesion to the image receiving layer is also useful as a release layer. Such compounds include silicone resins, e.g., silicone oil; fluorine resins, e.g., Teflon and fluorine-containing acrylic resins; polysiloxane resins; acetal resins, e.g., polyvinyl butyral, polyvinyl acetal, and polyvinyl formal; solid waxes, e.g., polyethylene wax and amide wax; and fluorine type or phosphoric ester type surface active agents.

The release layer is formed by applying a solution or an emulsion (latex) of the above-mentioned material in a solvent to the cushioning layer by various techniques, such as blade coating, roll coating, bar coating, curtain coating, gravure coating, hot-melt extrusion lamination, and the like. Alternatively, the solution or latex maybe applied to a carrier film by the above-described application techniques to form a coating film, which is transferred to the cushioning layer.

In an embodiment of the image receiving sheet structure, the image receiving layer may serve as a cushioning layer. In this embodiment, the image receiving sheet may have a layer structure of substrate/cushioning image receiving layer or a layer structure of substrate/undercoating layer/cushioning image receiving layer. In this embodiment, too, it is preferred for the cushioning image receiving layer be provided such that it is ready to be released and transferred to printing paper. In this case, the re-transfer image will have excellent gloss. The cushioning image receiving layer usually has a thickness of 5 to 100 μm, preferably 10 to 40 μm.

It is advisable to provide a backcoating layer on the reverse side (opposite to the image receiving layer side) of the substrate to improve transport properties of the image receiving sheet in a recording apparatus. The improvement on film transport properties is ensured by adding to the backcoating layer an antistatic agent (e.g., a surface active agent or fine tin oxide particles) and/or a matting agent (e.g., silicon oxide or polymethyl methacrylate particles). According to necessity, these additives may be added to not only the backcoating layer but other layers including the image receiving layer. The kind of the additive to be added depends on the purpose. Where, for example, a matting agent is needed, a matting agent having an average particle size of 0.5 to 10 μm is added in an amount of about 0.5 to 80% by weight based on the layer to which it is added. Where an antistatic agent is needed, an appropriate compound selected from various surface active agents and electrically conductive agents is added to reduce the surface resistivity of the layer to $10^{12}$ Ω or lower, preferably $10^{9}$ Ω or less, at 23° C. and 50% RH.

General-purpose polymers can be used as a binder of the backcoating layer, including gelatin, polyvinyl alcohol, methyl cellulose, nitrocellulose, cellulose acetate, aromatic polyamide resins, silicone resins, epoxy resins, alkyd resins, phenol resins, melamine resins, fluorine resins, polyimide resins, urethane resins, acrylic resins, urethane-modified silicone resins, polyethylene resins, polypropylene resins, polyester resins, Teflon resins, polyvinyl butyral resins, vinyl chloride resins, polyvinyl acetate, polycarbonate, organoboron compounds, aromatic esters, polyurethane fluoride, and polyether sulfone. Among them crosslinkable water-soluble resins can be crosslinked to become a binder effective in preventing fall-off of matting agent particles, improving scratch resistance of the backcoating layer, and preventing blocking of image receiving sheets during storage. The crosslinking of the crosslinkable water-soluble resins can be induced by at least one of heat, active light rays, and pressure. In some cases, an arbitrary adhesive layer may be provided between the substrate and the backcoating layer.

Organic or inorganic fine particles can be used as a matting agent added to the backcoating layer. Organic matting agents include particles of polymers obtained by radical polymerization, such as polymethyl methacrylate, polystyrene, polyethylene, and polypropylene; and condensed polymers, such as polyester and polycarbonate.

The backcoating layer preferably has a coating weight of about 0.5 to 5 $g/m^2$. A coating film thinner than 0.5 $g/m^2$ is difficult to form stably and tends to allow matting agent particles to fall off. If the coating thickness exceeds 5 $g/m^2$, the matting agent present therein must have a considerably large particle size to exhibit its effect. Such large particles in the backcoating layer will imprint themselves on an adjacent image receiving layer in a roll form. It would follow that the transfer image on the image receiving layer may suffer from image deficiency or unevenness on account of the imprinted surface unevenness particularly where the image forming layer is very thin.

It is preferred for the matting agent used in the backcoating layer to have a number-average particle size greater than the thickness of the particle-free area of the backcoating layer by 2.5 to 20 μm. It is necessary that matting agent particles of 8 μm or greater be present in the backcoating layer in an amount of 5 $mg/mm^2$ or more, particularly 6 to 600 $mg/mm^2$, thereby to reduce troubles due to foreign matter. In order to prevent image defects attributed to extraordinary large particles and to obtain desired performance with a reduced amount of a matting agent, it is preferred to use a matting agent whose sizes are narrowly distributed with a coefficient of variation σ/rn (obtained by dividing a standard deviation of a distribution by a mean) of 0.3 or smaller, preferably 0.15 or smaller.

The backcoating layer preferably contains an antistatic agent to prevent foreign matter attraction due to triboelectricity. A wide range of known antistatic agents can be used, such as cationic, anionic or nonionic surface active agents, polymeric antistatics, electrically conductive particles, and those described in 11290 no Kagaku Syohin, Kagaku Kogyo Nipposha, 875–876. Of these antistatic agents suitable for use in the backcoating layer are electrically conductive materials, such as carbon black, metal oxides, e.g., zinc oxide, titanium oxide, and tin oxide, and organic semiconductors. Electrically conductive fine particles are particularly preferred, for they do not separate from the backcoating layer to exert stable and environment-independent antistatic effects.

The backcoating layer can further contain various activators or release agents, such as silicone oil and fluorine resins, for improving coating capabilities or releasability. It is especially advisable to provide the above-described backcoating layer where the cushioning layer and the image receiving layer have a softening point of 70° C. or lower measured by thermochemical analysis (hereinafter referred to as a TMA softening point). The TMA softening point is obtained by observing the phase of a sample being heated at a given rate of temperature rise with a given load applied thereto. In the present invention, the temperature at which the phase of the sample begins to change is defined as a TMA softening point. Measurement of a TMA softening point can be made with, for example, Thermoflex supplied by Rigaku Denki-Sha.

In carrying out thermal transfer recording, each of the heat transfer sheets and the image receiving sheet are superposed on each other to prepare a laminate with the image forming layer of the former and the image receiving layer of the latter in contact.

A laminate of the heat transfer sheet and the image receiving sheet can be prepared through various methods. For example, the two sheets superposed on each other in the above-described manner are passed through a pair of pressure and heat rollers. The heating temperature of the rollers is 160° C. or lower, preferably 130° C. or lower.

Another method of preparing the laminate is vacuum holding, which has previously been described with respect to the recording apparatus. That is, the image receiving sheet is the first to be held by suction around a recording drum having a number of suction holes. The heat transfer sheet, which is designed to be slightly larger in size than the image receiving sheet, is then held on the image receiving sheet while the entrapped air is pressed out with a squeeze roller. Still another method of preparing the laminate comprises pulling the image receiving sheet to a recording drum, mechanically fixing the sheet onto the drum, and then fixing the heat transfer sheet thereon in the same manner as for the image receiving sheet. The vacuum holding method is especially advantageous in that temperature control (as required for heat rollers) is unnecessary, and uniform contact of the two sheets is accomplished quickly.

EXAMPLES

The present invention will now be illustrated in greater detail with reference to Examples, but it should be understood that the invention is not deemed to be limited thereto. Unless otherwise noted, all the parts and percents are by weight.

Example 1

1. Preparation of Heat Transfer Sheet (R)

1-1. Formation of Backcoating Layer

A coating composition for 1st backcoating layer was prepared according to the following formulation.

Formulation of Coating Composition for 1st Backcoating Layer:

| | |
|---|---|
| Aqueous dispersion of acrylic resin (Jurymer ET410, available from Nihon Junyaku Co., Ltd.; solid content: 20%) | 2 parts |
| Antistatic agent (water-born dispersion of tin oxide-antimony oxide; average particle size: 0.1 μm; solid content: 17%) | 7.0 parts |
| Polyoxyethylene phenyl ether | 0.1 part |
| Melamine compound (Sumitex Resin M-3, from Sumitomo Chemical Co., Ltd.) | 0.3 part |
| Distilled water | to make 100 parts |

A biaxially stretched polyethylene terephthalate (PETP) film having a thickness of 75 μm and an Ra of 0.01 μm on both sides was subjected to corona discharge treatment on one side. The coating composition for 1st backcoating layer was applied to the corona discharge treated side of the substrate to a dry thickness of 0.03 μm and dried at 180° C. for 30 seconds to form a first backcoating layer. The substrate used had a Young's modulus of 450 kg/mm$^2$ (≈4.4 GPa) in the MD and of 500 kg/mm$^2$ (≈4.9 GPa) in the TD; an F-5 value of 10 kg/mm$^2$ (≈98 MPa) in the MD and of 13 kg/mm$^2$ (≈127.4 MPa) in the TD; a thermal shrinkage percentage of 0.3% in the MD and of 0.1% in the TD both after heating at 100° C. for 30 minutes; a breaking strength of 20 kg/mm$^2$ (≈196 MPa) in the MD and of 25 kg/mm$^2$ (≈245 MPa) in the TD; and an elastic modulus at 20° C. of 400 kg/mm$^2$ (≈3.9 GPa).

A coating composition for 2nd backcoating layer was prepared according to the following formulation.

Formulation of Coating Composition for 2nd Backcoating Layer:

| | |
|---|---|
| Polyolefin (Chemipearl S-120, available from Mitsui Chemicals, Inc.; solid content: 27%) | 3.0 parts |

-continued

| | |
|---|---|
| Antistatic agent (water-born dispersion of tin oxide-antimony oxide; average particle size: 0.1 μm; solid content: 17%) | 2.0 parts |
| Colloidal silica (Snowtex C, available from Nissan Chemical Industries, Ltd.; solid content: 20%) | 2.0 parts |
| Epoxy compound (Denacol EX-614B, from Nagase Chemical Co., Ltd.) | 0.3 part |
| Distilled water | To make 100 parts |

The coating composition for 2nd backcoating layer was applied to the first backcoating layer to a dry thickness of 0.03 μm and dried at 170° C. for 30 seconds to form a second backcoating layer.

1-2. Formation of Light-heat Conversion Layer

The components shown below were mixed while agitating with a stirrer to prepare a coating composition for light-heat conversion layer.

Formulation of Coating Composition for Light-heat Conversion Layer:

| | |
|---|---|
| Infrared absorbing dye (NK-2014 available from Hayashibara Biochemical Laboratories, Inc.); a cyanine dye of formula: 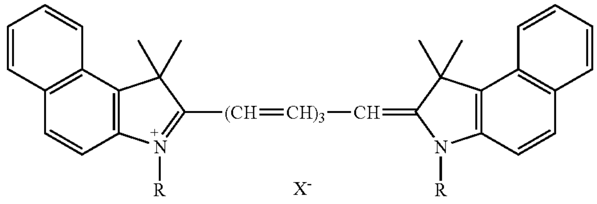 ($R = CH_3$, $X^- = ClO_4^-$ | 7.6 parts |
| Polyimide resin of the formula shown below (Rikacoat SN-20F available from New Japan Chemical Co., Ltd.; thermal decomposition temperature: 510° C.) 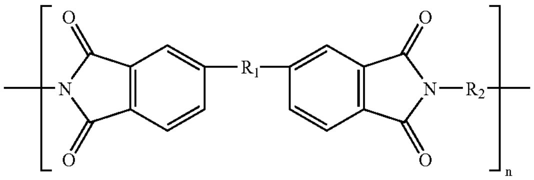 ($R_1 = SO_2$; $R_2$ = 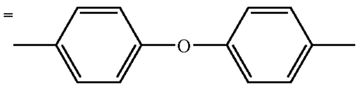 or 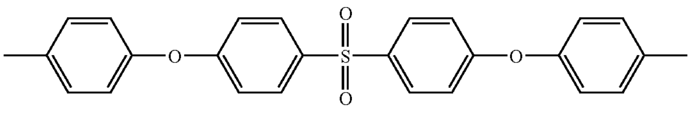 | 29.3 parts |
| Exxon Naphtha | 5.8 parts |
| N-Methylpyrrolidone | 1500 parts |
| Methyl ethyl ketone (MEK) | 360 parts |
| Fluorine type surface active agent (Magafac F-176PF, from Dainippon Ink & Chemicals, Inc.) | 0.5 part |
| Matting agent dispersion | 14.1 parts |

The matting agent dispersion used in the above formulation was prepared as follows. A mixture of 10 parts of true spherical silica powder having an average particle size of 1.5 μm (Seahostar KE-P150, from Nippon Shokubai Co., Ltd.), 2 parts of an acrylic ester-styrene copolymer as a dispersant (Joncryl 611, from Johnson Polymer Co., Ltd.), 16 parts of MEK, and 64 parts of N-methylpyrrolidone was put in a 200 ml polyethylene container together with 30 parts of glass beads having a diameter of 2 mm. The mixture in the container was dispersed in a paint shaker supplied by Toyo Seiki Co., Ltd. for 2 hours to prepare a matting agent dispersion.

The resulting coating composition was applied to the other side of the PETP film having the first and second backcoating layers with a wire bar and dried in an oven at 120° C. for 2 minutes to form a light-heat conversion layer. The light-heat conversion layer had an optical density ($OD_{LH}$) of 0.93 at 808 nm as measured with a UV spectrophotometer UV-240 supplied by Shimadzu Corp. A cut area of the light-heat conversion layer was observed under a scanning electron microscope (SEM) to find that the average layer thickness ($T_{LH}$) was 0.3 μm.

1-3. Formation of Red Image Forming Layer

The components of each of formulations 1 and 2 shown below were put in a kneader and preliminarily dispersed with shear while adding a small amount of the solvent shown. The rest of the solvent was added to the dispersion, followed by further dispersing in a sand mill for 2 hours to prepare red pigment dispersions 1 and 2, respectively.

Formulation 1 for Red Pigment Dispersion 1:

| | |
|---|---|
| Pigment Red 48:1 (C.I. No. 15865:1) (Lionol Red 2B-FG3300, from Toyo Ink Mfg. Co., Ltd.) | 8.93 parts |
| Polyvinyl butyral (S-LEC B BL-SH, available from Sekisui Chemical Co., Ltd.) | 7.50 parts |
| Pigment dispersant (Solsperse S-20000, available from ICI) | 0.35 parts |
| n-Propyl alcohol | 83.10 parts |

Formulation 2 for Red Pigment Dispersion 2:

| | |
|---|---|
| Pigment Red 48:3 (C.I. No. 15865:3) (Symuler Red 3108, from Dainippon Ink & Chemicals, Inc.) | 8.93 parts |
| Polyvinyl butyral (S-LEC B BL-SH, available from Sekisui Chemical Co., Ltd.) | 7.50 parts |
| Pigment dispersant (Solsperse S-20000, available from ICI) | 0.35 parts |
| n-Propyl alcohol | 83.10 parts |

The particle size distribution in the resulting pigment dispersions 1 and2 was measured with a laser scattering particle size distribution analyzer. As a result, the average particle size of the dispersion 1 was 192 nm, and that of the dispersion 2 was 193 nm.

The components shown below were mixed while agitating with a stirrer to prepare a coating composition for red image forming layer.

Formulation of Coating Composition for Red Image Forming Layer:

| | |
|---|---|
| n-Propyl alcohol | 321.5 parts |
| MEK | 89.3 parts |

-continued

| | |
|---|---|
| Waxes: | |
| Stearamide (Newtron-2, from Nippon Fine Chemical Co., Ltd.) | 0.824 parts |
| Behenic acid amide (Diamide BM, from Nippon Kasei Chemical Co., Ltd.) | 0.824 parts |
| Lauramide (Diamide Y, from Nippon Kasei Chemical Co., Ltd.) | 0.824 parts |
| Palmitamide (Daimide KP, from Nippon Kasei Chemical Co., Ltd.) | 0.824 parts |
| Oleamide (Damide O-200, from Nippon Kasei Chemical Co., Ltd.) | 0.824 parts |
| Erucamide (Diamide L-200, from Nippon Kasei Chemical Co., Ltd.) | 0.824 parts |
| Rosin (KE-311, from Arawaka Chemical Industries, Ltd.; resin acid content: 80 to 97% (composed of abietic acid 30 to 40%, neoabietic acid 10 to 20%, dihydroabietic acid 14%, and tetrahydroabietic acid 14%)) | 2.360 parts |
| Polyvinyl butyral (S-LEC B BL-SH, available from Sekisui Chemical Co., Ltd.) | 1.455 parts |
| Red pigment dispersion 1 | 77.40 parts |
| Red pigment dispersion 2 | 24.40 parts |
| Surface active agent (Megafac F-176PF, from Dainippon Ink & Chemicals, Inc.; solid content: 20%) | 1.216 parts |

The coating composition for red image forming layer was applied to the light-heat conversion layer with a wire bar for 1 minute and dried in an oven at 100° C. for 2 minutes to form a red image forming layer. There was thus prepared a heat transfer sheet (R) having the red image forming layer.

The thickness of the image forming layer (R) averaged 0.71 μm. The image forming layer had a surface hardness of 200 g or more as measured with a sapphire stylus, a smooster value of 27 mmHg (≈3.60 kPa) (at 23° C. and 55% RH), a coefficient of static friction of 0.08 (a preferred coefficient of static friction is 0.2 or smaller), and a water contact angle of 46.8°. The interfacial adhesive strength between the image forming layer and the light-heat conversion layer was 15.0 g/cm after 3-day storage at 45° C. and 75% RH. The amount of the free pigment dispersant was 1.9%.

2. Preparation of Heat Transfer Sheet (Y)

A heat transfer sheet (Y) was prepared in the same manner as for the heat transfer sheet (R), except for replacing the coating composition for red image forming layer with a coating composition for yellow image forming layer prepared according to the following formulation. The thickness of the yellow image forming layer was 0.42 μm.

Formulation of Yellow Pigment Dispersion 1:

| | |
|---|---|
| Polyvinyl butyral (S-LEC B BL-SH, from Sekisui Chemical Co., Ltd.) | 7.1 parts |
| Pigment Yellow 180 (C.I. No. 21290) (Novoperm Yellow P-HG, from Clariant (Japan) KK) | 12.9 parts |
| Pigment dispersant (Solsperse S-20000, from ICI) | 0.6 part |
| n-Propyl alcohol | 79.4 parts |

Formulation of Yellow Pigment Dispersion 2:

| | |
|---|---|
| Polyvinyl butyral (S-LEC B BL-SH, from Sekisui Chemical Co., Ltd.) | 7.1 parts |
| Pigment Yellow 139 (C.I. No. 56298) (Novoperm Yellow M2R 70, from Clariant (Japan) KK) | 12.9 parts |
| Pigment dispersant (Solsperse S-20000, from ICI) | 0.6 part |
| n-Propyl alcohol | 79.4 parts |

Formulation of Coating Composition for Yellow Image Forming Layer:

| | |
|---|---|
| Yellow pigment dispersion 1/yellow pigment dispersion 2 = 95/5 by part | 126 parts |
| Polyvinyl butyral (S-LEC B BL-SH, available from Sekisui Chemical Co., Ltd.) | 4.6 parts |
| Waxes: | |
| Stearamide (Newtron-2, from Nippon Fine Chemical Co., Ltd.) | 0.7 part |
| Behenic acid amide (Diamide BM, from Nippon Kasei Chemical Co., Ltd.) | 0.7 part |
| Lauramide (Diamide Y, from Nippon Kasei Chemical Co., Ltd.) | 0.7 part |
| Palmitamide (Daimide KP, from Nippon Kasei Chemical Co., Ltd.) | 0.7 part |
| Erucamide (Diamide L-200, from Nippon Kasei Chemical Co., Ltd.) | 0.7 part |
| Oleamide (Damide O-200, from Nippon Kasei Chemical Co., Ltd.) | 0.7 part |
| Nonionic surface active agent (Chemistat 1100, from Sanyo Chemical Industries, Ltd.) | 0.4 part |
| Rosin (KE-311, from Arawaka Chemical Industries, Ltd.) | 2.4 parts |
| Surface active agent (Magafac F-176PF, from Dainippon Ink & Chemicals, Inc.; solid content: 20%) | 0.8 part |
| n-Propyl alcohol | 793 parts |
| MEK | 198 parts |

The yellow image forming layer had a surface hardness of 200 g or more as measured with a sapphire stylus, a smooster value of 2.3 mmHg (≈0.31 kPa) (at 23° C. and 55% RH), a coefficient of static friction of 0.1, a surface energy of 24 mJ/m$^2$, and a water contact angle of 108.1°. When the resulting heat transfer sheet (Y) was irradiated with a laser beam having a light intensity of at least 1000 W/mm$^2$ on the exposed surface at a linear speed of at least 1 m/sec, the deformation percentage of the light-heat conversion layer was 150%.

3. Preparation of Heat Transfer Sheet (M)

A heat transfer sheet (M) was prepared in the same manner as for the heat transfer sheet (R), except for replacing the coating composition for red image forming layer with a coating composition for magenta image forming layer prepared according to the following formulation. The thickness of the magenta image forming layer was 0.38 μm.

Formulation of Magenta Pigment Dispersion 1:

| | |
|---|---|
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Symuler Brilliant Carmine 6B-229, from Dainippon Ink & Chemicals Inc.) | 15.0 parts |
| Pigment dispersant (Solsperse S-20000, from ICI) | 0.6 part |
| n-Propyl alcohol | 80.4 parts |

Formulation of Magenta Pigment Dispersion 2:

| | |
|---|---|
| Polyvinyl butyral (Denka Butyral #2000-L, available from Denki Kagaku Kogyo KK; Vicat softening point: 57° C.) | 12.6 parts |
| Pigment Red 57:1 (C.I. No. 15850:1) (Lionol Red 6B-4290G, from Toyo Ink Mgf. Co., Ltd.) | 15.0 parts |
| Pigment dispersant (Solsperse S-20000, from ICI) | 0.6 part |
| n-Propyl alcohol | 79.4 parts |

Formulation of Coating Composition for Magenta Image Forming Layer:

| | |
|---|---|
| Magenta pigment dispersion 1/magenta pigment dispersion 2 = 95/5 by part | 163 parts |
| Polyvinyl butyral (Denka Butyral #2000-L, available from Denki Kagaku Kogyo KK; Vicat softening point: 57° C.) | 4.0 parts |
| Waxes: | |
| Stearamide (Newtron-2, from Nippon Fine Chemical Co., Ltd.) | 1.0 part |
| Behenic acid amide (Diamide BM, from Nippon Kasei Chemical Co., Ltd.) | 2.0 parts |
| Palmitamide (Daimide KP, from Nippon Kasei Chemical Co., Ltd.) | 1.0 part |
| Erucamide (Diamide L-200, from Nippon Kasei Chemical Co., Ltd.) | 1.0 part |
| Oleamide (Diamide O-200, from Nippon Kasei Chemical Co., Ltd.) | 1.0 part |
| Nonionic surface active agent (Chemistat 1100, from Sanyo Chemical Industries, Ltd.) | 0.7 part |
| Rosin (KE-311, from Arawaka Chemical Industries, Ltd.) | 4.6 parts |
| Pentaerythritol tetraacrylate (NK Ester A-TMMT, from Shin-Nakamura Chemical Co., Ltd.) | 2.5 parts |
| Surface active agent (Megafac F-176PF, from Dainippon Ink & Chemicals Inc.; solid content: 20%) | 1.3 part |
| n-Propyl alcohol | 848 parts |
| MEK | 246 parts |

The image forming layer had a surface hardness of 200 g or more as measured with a sapphire stylus, a smooster value of 3.5 mmhg (≈0.47 kPa) (at 23° C. and 55% RH), a coefficient of static friction of 0.08, a surface energy of 25 mJ/m$^2$, and a water contact angle of 98.8°. When the resulting heat transfer sheet (M) was irradiated with a laser beam having a light intensity of at least 1000 W/mm$^2$ on the exposed surface at a linear speed of at least 1 m/sec, the deformation percentage of the light-heat conversion layer was 160%.

4. Preparation of Heat Transfer Sheet (C)

A heat transfer sheet (C) was prepared in the same manner as for the heat transfer sheet (R), except for replacing the coating composition for red image forming layer with a coating composition for cyan image forming layer prepared according to the following formulation. The thickness of the magenta image forming layer was 0.45 μm.

Formulation of Cyan Pigment Dispersion 1:

| | |
|---|---|
| Polyvinyl butyral (S-LEC B BL-SH, available from Sekisui Chemical Co., Ltd.) | 12.6 parts |
| Pigment Blue 15:4 (C.I. No. 74160) (Cyanine Blue 700-10FG, from Toyo Ink Mfg. Co., Ltd.) | 15.0 parts |
| Pigment dispersant (PW-36, from Kusumoto Chemicals Ltd.) | 0.8 part |
| n-Propyl alcohol | 110 parts |

Formulation of Cyan Pigment Dispersion 2:

| | |
|---|---|
| Polyvinyl butyral (S-LEC B BL-SH, available from Sekisui Chemical Co., Ltd.) | 12.6 parts |
| Pigment Red 15 (C.I. No. 74160) (Lionol Blue 7027, from Toyo Ink Mgf. Co., Ltd.) | 15.0 parts |
| Pigment dispersant (PW-36, from Kusumoto Chemicals Ltd.) | 0.8 part |
| n-Propyl alcohol | 110 parts |

Formulation of Coating Composition for Cyan Image Forming Layer:

| | |
|---|---|
| Cyan pigment dispersion 1/cyan pigment dispersion 2 = 90:10 by part | 118 parts |
| Polyvinyl butyral (S-LEC B BL-SH, available from Sekisui Chemical Co., Ltd.) | 5.2 parts |
| Inorganic pigment MEK-ST | 1.3 part |
| Waxes: | |
| Stearamide (Newtron-2, from Nippon Fine Chemical Co., Ltd.) | 1.0 part |
| Behenic acid amide (Diamide BM, from Nippon Kasei Chemical Co., Ltd.) | 1.0 part |
| Lauramide (Diamide Y, from Nippon Kasei Chemical Co., Ltd.) | 1.0 part |
| Palmitamide (Daimide KP, from Nippon Kasei Chemical Co., Ltd.) | 1.0 part |
| Erucamide (Diamide L-200, from Nippon Kasei Chemical Co., Ltd.) | 1.0 part |
| Oleamide (Damide O-200, from Nippon Kasei Chemical Co., Ltd.) | 1.0 part |
| Rosin (KE-311, from Arawaka Chemical Industries, Ltd.) | 2.8 parts |
| Pentaerythritol tetraacrylate (NK Ester A-TMMT, from Shin-Nakamura Chemical Co., Ltd.) | 1.7 parts |
| Surface active agent (Megafac F-176PF, from Dainippon Ink & Chemicals Inc.; solid content: 20%) | 1.7 parts |
| n-Propyl alcohol | 890 parts |
| MEK | 247 parts |

The cyan image forming layer had a surface hardness of 200 g or more as measured with a sapphire stylus, a smooster value of 7.0 mmHg (≈0.93 kPa) (at 23° C. and 55% RH), a coefficient of static friction of 0.08, a surface energy of 25 mJ/m$^2$, and a water contact angle of 98.8°. When the resulting heat transfer sheet (C) was irradiated with a laser beam having a light intensity of at least 1000 W/mm$^2$ on the exposed surface at a linear speed of at least 1 m/sec, the deformation percentage of the light-heat conversion layer was 165%.

5. Preparation of Heat Transfer Sheet (K)

A heat transfer sheet (K) was prepared in the same manner as for the heat transfer sheet (R), except for replacing the coating composition for red image forming layer with a coating composition for black image forming layer prepared as follows. The thickness of the black image forming layer was 0.60 μm.

The components of each of formulations 1 and 2 shown below were put in a kneader and preliminarily dispersed with shear while adding a small amount of the solvent shown. The rest of the solvent was added to the dispersion, followed by further dispersing in a sand mill for 2 hours to prepare black pigment dispersions 1 and 2, respectively.

Formulation of Black Pigment Dispersion 1:

| | |
|---|---|
| Polyvinyl butyral (S-LEC B BL-SH, available from Sekisui Chemical Co., Ltd.) | 12.6 parts |
| Pigment Black 7 (Carbon Black C.I. No. 77266) (Mitsubishi Carbon Black #5, available from Mitsubishi Chemical Corp.; PVC blackness: 1) | 4.5 parts |
| Dispersant (Solsperse S-20000, from ICI) | 0.8 part |
| n-Propyl alcohol | 79.4 parts |

Formulation of Black Pigment Dispersion 2:

| | |
|---|---|
| Polyvinyl butyral (S-LEC B BL-SH, available from Sekisui Chemical Co., Ltd.) | 12.6 parts |
| Pigment Black 7 (Carbon Black C. I. No. 77266) (Mitsubishi Carbon Black MA100; PVC blackness: 10) | 10.5 parts |
| Dispersant (Solsperse S-20000, from ICI) | 0.8 part |
| n-Propyl alcohol | 79.4 parts |

The components shown below were mixed while agitating with a stirrer to prepare a coating composition for black image forming layer.

Formulation of Coating Composition for Black Image Forming Layer:

| | |
|---|---|
| Black pigment dispersion 1/black pigment dispersion 2 = 70/30 by part | 185.7 parts |
| Polyvinyl butyral (S-LEC B BL-SH, available from Sekisui Chemical Co., Ltd.) | 11.9 parts |
| Waxes: | |
| Stearamide (Newtron-2, from Nippon Fine Chemical Co., Ltd.) | 1.7 parts |
| Behenic acid amide (Diamide BM, from Nippon Kasei Chemical Co., Ltd.) | 1.7 parts |
| Lauramide (Diamide Y, from Nippon Kasei Chemical Co., Ltd.) | 1.7 parts |
| Palmitamide (Diamide KP, from Nippon Kasei Chemical Co., Ltd.) | 1.7 parts |
| Erucamide (Diamide L-200, from Nippon Kasei Chemical Co., Ltd.) | 1.7 parts |
| Oleamide (Diamide O-200, from Nippon Kasei Chemical Co., Ltd.) | 1.7 parts |
| Rosin (KE-311, from Arawaka Chemical Industries, Ltd.) | 11.4 parts |
| Surface active agent (Megafac F-176PF, from Dainippon Ink & Chemicals Inc.; solid content: 20%) | 2.1 parts |
| Inorganic pigment (MEK-K, 30% MEK solution available from Nissan Chemical Industries, Ltd.) | 7.1 parts |
| n-Propyl alcohol | 1050 parts |
| MEK | 295 parts |

The particle size distribution of the resulting coating composition for black image forming layer was measured with a laser scattering particle size distribution analyzer. As a result, the average particle size was 0.25 μm, and the proportion of particles of 1 μm or greater was 0.5%.

The image forming layer had a surface hardness of 200 g or more as measured with a sapphire stylus, a smooster value of 9.3 mmHg (1.24 kPa) (at 23° C. and 55% RH), a coefficient of static friction of 0.08, a surface energy of 29 mJ/m$^2$, a water contact angle of 94.8°, a reflective optical density of 1.82, a thickness of 0.60 μm, and an $OD_I/T_I$ ratio of 3.03. When the resulting heat transfer sheet (K) was irradiated with a laser beam having a light intensity of at least 1000 W/mm$^2$ on the exposed surface at a linear speed of at least 1 m/sec, the deformation percentage of the light-heat conversion layer was 168%.

6. Preparation of Image Receiving Sheet

A coating composition for cushioning layer and a coating composition for image receiving layer were prepared according to the following formulations.

Formulation of Coating Composition for Cushioning Layer:

| | |
|---|---|
| Vinyl chloride-vinyl acetate copolymer as a main binder (MPR-TSL, available from Nisshin Chemical Industry Co., Ltd.) | 20 parts |

-continued

| | |
|---|---|
| Plasticizer (Paraplex G-40, available from The C. P. Hall Co.) | 10 parts |
| Fluorine-type surface active agent as a coating aid (Megafac F-177, available from Dainippon Ink & Chemicals, Inc.) | 0.5 part |
| Antistatic agent (SAT-5 Supper (IC), quaternary ammonium salt available from Nihon Jynyaku Co., Ltd.) | 0.3 part |
| MEK | 60 parts |
| Toluene | 10 parts |
| N,N-Dimethylformamide | 3 parts |

Formulation of Coating Composition for Image Receiving Layer:

| | |
|---|---|
| Polyvinyl butyral (S-LEC B BL-SH, available from Sekisui Chemical Co., Ltd.) | 8 parts |
| Antistatic agent (Sanstat 2012A, available from Sanyo Chemical Industries, Ltd.) | 0.7 part |
| Surface active agent (Megafac F-176PF, from Dainippon Ink & Chemicals, Inc.; solid content: 20%) | 0.1 part |
| n-Propyl alcohol | 20 parts |
| Methanol | 20 parts |
| 1-Methoxy-2-propanol | 50 parts |

The coating composition for cushioning layer was applied to a white PETP film having a thickness of 130 μm (Lumirror #130E58, available from Toray Industries, Inc.) with a small-width applicator to a dry thickness of about 20 μm and dried to form a cushioning layer. The coating composition for image receiving layer was applied thereon to a dry thickness of about 2 μm and dried to form an image receiving layer. The white PETP film used as a substrate is a void-containing PETP layer (thickness: 116 μm; void: 20%) laminated on both sides thereof with a titanium oxide-containing PETP layer (thickness: 7 μm; titanium oxide content: 2%) (total thickness: 130 μm; specific gravity: 0.8).

Each of the resulting heat transfer elements was wound into a roll and stored at room temperature for one week before image formation.

The resulting image receiving layer had an Ra of 0.02 μm (a preferred Ra is 0.01 to 0.4 μm), a surface waviness of 1.2 μm (a preferred surface waviness is 2 μm or smaller), a smooster value of 0.8 mmHg (≈0.11 kPa) (at 23° C. and 55% RH), a coefficient of static friction of 0.37 (a preferred coefficient of static friction is 0.8 or smaller), a surface energy of 29 mJ/m$^2$, and a water contact angle of 85° C.

7. Laser Recording

A multicolor image formation by thermal transfer and re-transfer to printing paper were carried out in accordance with the scheme of the system configuration shown in FIG. 4, in which Luxel FINALPROOF 5600 supplied by Fuji Photo Film Co., Ltd. was used as a laser thermal transfer recording apparatus.

A56 cm wide and 79 cm long cut sheet of the image receiving sheet was held by suction on a recording drum having a diameter of 380 mm (a preferred drum diameter is 360 mm or greater) through suction holes of 1 mm in diameter of the drum (one hole per 3 cm by 8 cm area). A 61 cm wide and 84 cm long cut sheet of the heat transfer sheet (R) was superposed on the image receiving sheet with its four edges extending evenly from the edges of the image receiving sheet while being squeezed with a squeeze roller so that the two sheets were brought into intimate contact while allowing entrapped air to escape and be sucked. The degree of vacuum of the drum, measured with the suction holes closed, was (atmospheric pressure minus 150) mmHg (≈81.13 kPa). The drum was rotated, and the heat transfer sheet was scanned with semiconductor laser light having a wavelength of 808 nm and a spot diameter of 7 μm on the surface of the light-heat conversion layer, the laser being moving in a direction (slow scan direction) perpendicular to the drum rotating direction (fast scan direction), under the following conditions to carry out recording of a solid red image. The light source was multibeams arranged in a two-dimensional parallelogram consisting of five lines of laser beams arrayed in the fast scan direction and three rows of laser beams arrayed in the slow scan direction.

Laser power: 110 mW

Drum rotation: 500 rpm

Slow scanning pitch: 6.35 μm

Environment: (1) 20° C., 40% RH, (2) 23° C., 50% RH, (3) 26° C., 65% RH

The recorded image size was 515 mm wide and 728 mm long, and the resolution was 2600 dpi.

After completion of laser recording, the laminate was removed from the drum, and the heat transfer sheet (R) was stripped by hand off the image receiving sheet to transfer a solid red image to the image receiving sheet. The image on the image receiving sheet was then re-transferred to a sheet of printing paper (Reflection II, available from Stora Enso) by use of a thermal transfer apparatus having the following specification to obtain a solid red image. The dynamic frictional coefficient of the insertion table against a PETP film (the substrate of the image receiving sheet) was 0.1 to 0.7. The speed of transporting the laminate (image receiving sheet and the printing paper) was 15 to 50 mm/sec. The heat rolls were made of a material having a Vickers hardness of 70 (a preferred Vickers hardness of the material is 10 to 100).

Separately, a multicolor image was formed on another sheet of the same printing paper by successively imagewise transferring the image forming layer of each of the heat transfer sheets (R), (C), (M), (Y), and (K) to another image receiving sheet by laser thermal transfer and re-transferring the resulting multicolor image onto the printing paper in the same manner as described above. As a result, it was confirmed that a multicolor image was formed with satisfactory image quality and a stable transfer density under various temperature and humidity conditions even with a high-energy two-dimensional array of multiple laser beams.

Example 2

1. Preparation of Heat Transfer Sheet (B)

A heat transfer sheet (B) for blue image formation was prepared in the same manner as for the heat transfer sheet (R) of Example 1, except for replacing the coating composition for red image forming layer with a coating composition for blue image forming layer prepared as follows. The blue image forming layer of the resulting heat transfer sheet (B) had a thickness of 0.71 μm.

Formulation of Blue Pigment Dispersion:

| | |
|---|---|
| Pigment Blue 60 (C.I. No. 69800) (Fastogen Super Blue 6070S, from Dainippon Ink & Chemicals) | 4.02 parts |
| Pigment Blue 15:6 (C.I. No. 74160) (Lionol Blue 7600, from Toyo Ink Mfg.) | 4.02 parts |
| Pigment Violet 23 (C.I. No. 51319) (Hosterperm Violet RL-NF, from Clariant (Japan) KK) | 0.89 part |

-continued

| | |
|---|---|
| Polyvinyl butyral (S-LEC B BL-SH, from Sekisui Chemical Co., Ltd.) | 7.50 parts |
| Pigment dispersant (Solsperse S-20000, from ICI) | 0.47 part |
| n-Propyl alcohol | 83.10 parts |

The average particle size of the resulting blue pigment dispersion was 242 nm as measured with a laser scattering particle size distribution analyzer.

The components shown below were mixed up while agitating with a stirrer to prepare a coating composition for blue image forming layer.

Formulation of Coating Composition for Blue Image Forming Layer:

| | |
|---|---|
| n-Propyl alcohol | 321.5 parts |
| MEK | 89.3 parts |
| Waxes: | |
| Stearamide (Newtron-2, from Nippon Fine Chemical Co., Ltd.) | 0.824 parts |
| Behenic acid amide (Diamide BM, from Nippon Kasei Chemical Co., Ltd.) | 0.824 parts |
| Lauramide (Diamide Y, from Nippon Kasei Chemical Co., Ltd.) | 0.824 parts |
| Palmitamide (Daimide KP, from Nippon Kasei Chemical Co., Ltd.) | 0.824 parts |
| Oleamide (Diamide O-200, from Nippon Kasei Chemical Co., Ltd.) | 0.824 parts |
| Erucamide (Diamide L-200, from Nippon Kasei Chemical Co., Ltd.) | 0.824 parts |
| Rosin (KE-311, from Arawaka Chemical Industries, Ltd.) | 2.360 parts |
| Polyvinyl butyral (S-LEC B BL-SH, from Sekisui Chemical Co., Ltd.) | 1.455 part |
| Blue pigment dispersion | 101.80 parts |
| Surface active agent (Megafac F-176PF, from Dainippon Ink & Chemicals Inc.; solid content: 20%) | 1.216 parts |

The blue image forming layer had a surface hardness of 200 g or more as measured with a sapphire stylus. After storage at 45° C. at 75% RH for 3 days, the interfacial adhesive strength between the image forming layer and the light-heat conversion layer was 19.3 g/cm. The amount of the free pigment dispersant was 0%. The interfacial adhesive strength between the image forming layer and the light-heat conversion layer was 19.3 g/cm. The amount of the free pigment dispersant was 0%.

A solid blue image was formed on printing paper in the same manner as in Example 1, except for using the heat transfer sheet (B) in place of the heat transfer sheet (R). Separately, a multicolor image was formed on printing paper in the same manner as in Example 1, except for using the heat transfer sheet (B) in place of the heat transfer sheet (R).

Comparative Example 1

A heat transfer sheet (R) was prepared in the same manner as in Example 1, except for changing the amounts of the pigment dispersant used in pigment dispersions 1 and 2 both to 0.47 part. The red image forming layer had a thickness of 0.71 μm. The amount of the free dispersant was 2.5%. After storage at 45° C. and 75% RH for 3 days, the interfacial adhesive strength between the image forming layer and the light-heat conversion layer was 7.5 g/cm.

A solid red image was formed on printing paper in the same manner as in Example 1, except for using the above-prepared heat transfer sheet (R) in place of the heat transfer sheet (R) of Example 1. Separately, a multicolor image was formed on printing paper in the same manner as in Example 1, except for using the heat transfer sheet (R) in place of the heat transfer sheet (R) of Example 1.

Evaluation:

The solid monochromatic images and the multicolor images obtained in Examples 1 and 2 and Comparative Example 1 were evaluated as follows.

1) Optical Density ($OD_I$) of Solid Image

The reflective image density of the solid image was measured with a densitometer X-rite 938 (available from X-rite) using a filter giving the maximum optical density.

2) Resolution

The multicolor image formed by using the heat transfer materials having been stored at 45° C. and 75% RH for 3 days was observed with a microscope. Fine line reproducibility and dot sharpness were organoleptically rated according to the following rating system.

A Dots having well-defined sharp edges (without excess or defect) are formed from highlights to shadows.

B Although dots are reproduced from highlights to shadows, the shapes of the dots are not faithful to the original image data, suffering from excess or defect.

C Dots are missing in highlights, or plugging occurs in shadows. Dots suffer from considerable excess or defect.

The results obtained are shown in Table 1 below. In Table 1 are also shown the thickness ($T_I$; μm), the optical density ($OD_I$), and the $OD_I/T_I$ of the heat transfer sheet (R) or (B). It is seen from the results in Table 1 that the image forming materials of Examples 1 and 2 are capable of forming an image with a hue approximate to a target one and exhibit excellent resolution even after storage and high light resistance.

TABLE 1

| | Heat | Image Forming Layer | | | | Adhesive | Free Pigment | |
|---|---|---|---|---|---|---|---|---|
| | Transfer | $OD_I$ | | | | Strength | Dispersant | |
| | Sheet | Maximum | Filter | $T_I$ (μm) | $OD_I/T_I$ | (g/cm) | (wt %) | Resolution |
| Example 1 | R | 1.55 | G | 0.71 | 2.18 | 15.0 | 1.9 | A |
| Example 2 | B | 2.35 | R | 0.71 | 3.31 | 19.3 | 0 | A |
| Compara. Example 1 | R | 1.55 | G | 0.71 | 2.18 | 7.5 | 2.5 | C |

The multicolor image forming material according to the present invention stably maintains high resolving power with time and reproduces hues that are not obtained with conventional process color formulations. The present invention broadens the range of reproducible hues and the freedom of design in printing.

This application is based on Japanese Patent application JP 2002-251872, filed Aug. 29, 2002, the entire content of which is hereby incorporated by reference, the same as if set forth at length.

What is claimed is:

1. A multicolor image forming system comprising:

an image receiving sheet comprising an image receiving layer; and at least five heat transfer sheets different in color each comprising a substrate, a light-heat conversion layer and an image forming layer, each of the heat transfer sheets being adapted to be superposed on the image receiving sheet with the image forming layer facing the image receiving layer and irradiated with laser light to transfer the irradiated area of the image forming layer to the image receiving layer to record an image on the image receiving sheet, wherein an area of the recording has a size of 515 mm by 728 mm or larger, the image forming layer of at least one of the heat transfer sheets has a thickness of 0.6 μm or greater, and the at least one of the heat transfer sheets has an adhesive strength of 8 g/cm or higher between the light-heat conversion layer and the image forming layer in a non-irradiated area thereof.

2. The multicolor image forming system according to claim 1, wherein at least one of the heat transfer sheets comprises a pigment and a pigment dispersant in the image forming layer thereof, a proportion of the pigment dispersant that is not adsorbed on the pigment being 2.0% by weight or less based on a total solids content of the image forming layer.

3. The multicolor image forming system according to claim 1, wherein at least one of the heat transfer sheets comprises a pigment and a pigment dispersant in the image forming layer thereof, a proportion of the pigment dispersant that is not adsorbed on the pigment being 1.0% by weight or less based on a total solids content of the image forming layer.

4. The multicolor image forming system according to claim 2, wherein the pigment dispersant is selected from the group consisting of a polymeric dispersant, a phosphoric ester compound, and a copper phthalocyanine sulfonic acid compound, the polymeric dispersant being a copolymer comprising (a) $(C_2H_5)_2N—(CH_2)_z—O—$ wherein z is 2 or 3, (b) ethylene glycol, and (c) propylene glycol at an (a):(b):(c) molar ratio of 1:10 to 20:25 to 40 or a polyblend containing the copolymer.

5. The multicolor image forming system according to claim 1, wherein the image forming layer of at least one of the heat transfer sheets has an optical density to thickness ratio of 1.6 or higher, the thickness being expressed in micrometers and the optical density being measured at a wavelength of 808 nm.

6. The multicolor image forming system according to claim 1, wherein the image forming layer of at least one of the heat transfer sheets has an optical density to thickness ratio of 1.8 or higher, the thickness being expressed in micrometers and the optical density being measured at a wavelength of 808 nm.

7. The multicolor image forming system according to claim 1, wherein the image forming layer of at least one of the heat transfer sheets has an optical density to thickness ratio of 2.50 or higher, the thickness being expressed in micrometers and the optical density being measured at a wavelength of 808 nm.

8. The multicolor image forming system according to claim 1, which has a resolution of 2400 dpi or higher.

9. The multicolor image forming system according to claim 1, which has a resolution of 2600 dpi or higher.

10. The multicolor image forming system according to claim 1, wherein the image forming layer of each of the heat transfer sheets and the image receiving layer of the image receiving sheet each have a water contact angle of 7.0 to 120.0°.

11. The multicolor image forming system according to claim 1, wherein the image forming layer of each of the heat transfer sheets and the image receiving layer of the image receiving sheet each have a water contact angle of 30.0 to 100.0°.

12. A method for forming a multicolor image comprising the steps of:

superposing each of at least five heat transfer sheets according to claim 1 on an image receiving sheet according to claim 1 with the image forming layer of the heat transfer sheet facing the image receiving layer of the image receiving sheet;

imagewise irradiating the superposed heat transfer sheet with laser light; and transferring the irradiated area of the image forming layer to the image receiving layer of the image receiving sheet in the form of a thin film to record an image.

* * * * *